United States Patent
Xu et al.

(10) Patent No.: US 7,390,581 B2
(45) Date of Patent: *Jun. 24, 2008

(54) VICINAL GALLIUM NITRIDE SUBSTRATE FOR HIGH QUALITY HOMOEPITAXY

(75) Inventors: Xueping Xu, Stanford, CT (US); Robert P. Vaudo, New Milford, CT (US); Jeffrey S. Flynn, Litchfield, CT (US); George R. Brandes, Southbury, CT (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/431,990

(22) Filed: May 11, 2006

(65) Prior Publication Data

US 2006/0228584 A1 Oct. 12, 2006

Related U.S. Application Data

(63) Continuation of application No. 10/714,307, filed on Nov. 14, 2003, now Pat. No. 7,118,813.

(51) Int. Cl.
*B32B 9/00* (2006.01)
*C30B 25/00* (2006.01)

(52) U.S. Cl. .......................... 428/698; 117/87; 117/101; 117/952

(58) Field of Classification Search .................. None
See application file for complete search history.

(56) References Cited

U.S. PATENT DOCUMENTS 5,637,531 A 6/1997 Porowski et al.

| | | |
|---|---|---|
| 6,447,604 B1 | 9/2002 | Flynn et al. |
| 6,455,877 B1 | 9/2002 | Ogawa et al. |
| 6,596,079 B1 | 7/2003 | Vaudo et al. |

(Continued)

FOREIGN PATENT DOCUMENTS

WO 2005050709 A2 6/2005

OTHER PUBLICATIONS

Bockowski, M., et al., Directional crystallization of GaN on high-pressure solution grown substrates by growth from solution and HVPE, J. Cryst. Growth, Dec. 2002, pp. 194-206, vol. 246, No. 3-4.

(Continued)

*Primary Examiner*—Jennifer McNeil
*Assistant Examiner*—Timothy M Speer
(74) *Attorney, Agent, or Firm*—Vincent K. Gustafson; Intellectual Property/Technology Law; Julio Garceran

(57) ABSTRACT

A III-V nitride, e.g., GaN, substrate including a (0001) surface offcut from the <0001> direction predominantly toward a direction selected from the group consisting of <10-10> and <11-20> directions, at an offcut angle in a range that is from about 0.2 to about 10 degrees, wherein the surface has a RMS roughness measured by 50×50 µm² AFM scan that is less than 1 nm, and a dislocation density that is less than 3E6 cm⁻². The substrate may be formed by offcut slicing of a corresponding boule or wafer blank, by offcut lapping or growth of the substrate body on a corresponding vicinal heteroepitaxial substrate, e.g., of offcut sapphire. The substrate is usefully employed for homoepitaxial deposition in the fabrication of III-V nitride-based microelectronic and opto-electronic devices.

35 Claims, 19 Drawing Sheets

U.S. PATENT DOCUMENTS 7,064,357 B2    6/2006   Ueta et al.
2001/0030329 A1* 10/2001 Ueta et al. ................. 257/103
2003/0213964 A1  11/2003 Flynn et al.
2005/0104162 A1   5/2005 Xu et al.

OTHER PUBLICATIONS

Frayssinet, E., et al., High electron mobility in AlGaN/GaN heterostructures grown on bulk GaN substrates, Appl. Phys. Letters, Oct. 16, 2000, pp. 2551-2553, vol. 77, No. 16.

Kamp, M., et al., GaN Homoepitaxy for Device Applications, MRS Internet J. Nitride Semicond. Res., 1999, pp. G.10.2, vol. 4S1.

Nakamura, Shuji, et al., High-Power, Long-Lifetime InGaN/GaN/AlGaN-Based Laser Diodes Grown on Pure GaN Substrates, Jpn. J. Appl. Phys., Mar. 15, 1998, pp. L309-L312, vol. 37, No. Pt. 2, No. 3B.

Ponce, F.A., et al., Spatial distribution of the luminescence in GaN thin films, Appl. Phys. Letters, Jan. 1, 1996, pp. 57-59, vol. 68, No. 1.

Porowski, S., et al., Thermodynamical properties of III-V nitrides and crystal growth of GaN at high N2 pressure, J. Cryst. Growth, Jun. 2, 1997, pp. 174-188, vol. 178, No. 1-2.

Zauner, A.R.A., et al., Homo-epitaxial GaN growth on exact and misoriented single crystals: suppression of hillock formation, J. Cryst. Growth, Mar. 2000, pp. 435-443, vol. 210, No. 4.

* cited by examiner

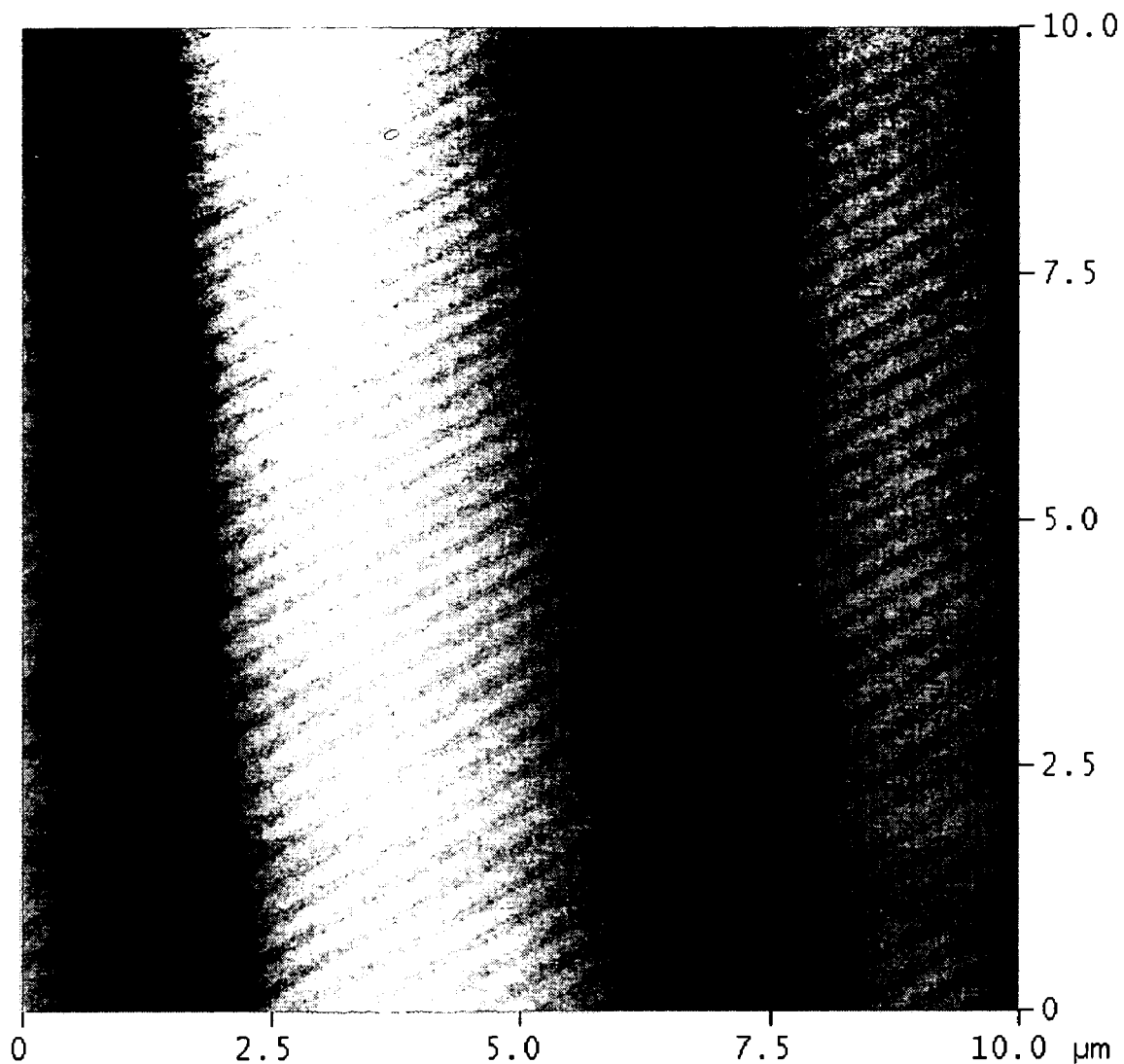
FIG. 9
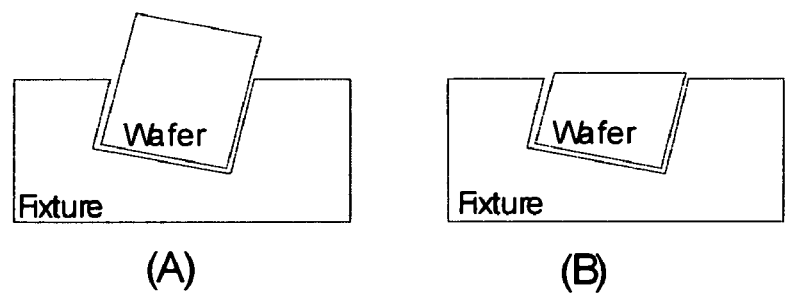
(A)                        (B)
FIGS. 10A-B

VICINAL GALLIUM NITRIDE SUBSTRATE FOR HIGH QUALITY HOMOEPITAXY

CROSS-REFERENCE TO RELATED APPLICATIONS

This is a continuation of U.S. patent application Ser. No. 10/714,307 filed Nov. 14, 2003, now U.S. Pat. No. 7,118,813 now allowed.

BACKGROUND OF THE INVENTION

1. Field the Invention

The present invention relates to vicinal III-V nitride substrates, e.g., vicinal gallium nitride substrates, such as are usefully employed for deposit of homoepitaxial films thereon in the fabrication of high quality electronic and opto-electronic devices.

2. Description of the Related Art

Gallium nitride (GaN) and related III-IV nitride alloys are wide bandgap semiconductor materials that have application in opto-electronics (e.g., in fabrication of blue and UV light emitting diodes and laser diodes) and in high-frequency, high-temperature and high-power electronics. In such high-performance devices, high quality epitaxial films must be grown in the substrate.

Gallium nitride-based electronic devices are typically grown on foreign (heteroepitaxial) substrates such as sapphire and silicon carbide. Due to the resultant mismatch of lattice constants and thermal coefficient of expansion differences between the gallium nitride device layers and the foreign substrate, a high density of defects typically is produced in the gallium nitride device layers, adversely affecting device performance.

Growth of gallium nitride device layers is typically performed by metal-organic vapor phase epitaxy (MOVPE), with a buffer layer first being grown on the foreign substrate, followed by growth of a few microns thickness of gallium nitride and associated device layers. To reduce crystal defects in the gallium nitride layer, techniques such as epitaxially laterally overgrown (ELOG) growth have been employed on sapphire or silicon carbide.

In view of the morphological and structural deficiencies associated with use of heteroepitaxial substrates, native gallium nitride substrates would be ideal for many gallium-nitride based microelectronic devices. Gallium nitride substrates can be prepared by various methods.

Porowski et al. U.S. Pat. No. 5,637,531 describes growth of bulk gallium nitride from metallic gallium at high nitrogen pressure, but the disclosed method has achieved maximum crystal size of only about 10 mm platelets (S. Porowski and I. Grzegory, J. Cryst. Growth, Vol. 78, 174 (1997), M. Bockowski, J. Cryst. Growth, Vol. 246, 194 (2002)). Gallium nitride crystalline platelets are c-plane structures and have polar surfaces, with one face of the platelet terminated with gallium and the other face terminated with nitrogen. Each of the respective surfaces has distinct properties, and most gallium nitride-based devices are as a matter of preference grown on the gallium-terminated surface, i.e., the (0001) surface. Although the size of the crystal platelets is small, homoepitaxial growth has been carried out on samples of such platelets. For example, MOVPE homoepitaxy has been carried out on gallium nitride crystalline platelets with lateral dimensions less than 5 mm (F. A. Ponce, D. P. Bour, W. Götz and P. J. Wright, Appl. Phys. Lett., 68(1), 57 (1996)). High electron mobility transistor (HEMT) structures based on AlGaN/GaN heterostructures have been grown on 8×8 $mm^2$ gallium nitride samples by molecular beam epitaxy (E. Frayssington et al., Appl. Phys. Lett. 77, 2551 (2000)). InGaN/GaN multiple quantum well (MQW) structures and double heterostructure LEDs have been grown on about 6×8 $mm^2$ gallium nitride samples by MOVPE (M. Kamp et al., MRS Internet J. Nitride Semicond. Res. 4S1, G.10.2 (1999)). MOVPE homoepitaxial growth on nitrogen-terminated gallium nitride (000$\bar{1}$) crystal platelets and on surfaces slightly tilted away from the (000$\bar{1}$) plane has been reported (A. R. A. Zauner et al., J. Crystal Growth, 210, 435 (2000)).

Since the manufacture of opto-electronic and electronic devices requires large area substrates, various devices have been grown on large-area gallium nitride substrates produced by other techniques. Devices include gallium nitride-based laser diodes (S. Nakamura, et al., Jpn. J. Appl. Phys. 37, L309 (1998)). A complicated growth sequence was employed by Nakamura et al. to form such laser diodes. First, a 2 micron thick MOVPE gallium nitride layer was grown on a sapphire substrate, followed by deposition of a 2 micron thick silicon dioxide layer patterned into stripes. A 20 micron thick gallium nitride layer then was grown by MOVPE using ELOG technique to cover the silicon dioxide pattern and achieve a flat gallium nitride surface. This was followed by hydride vapor phase epitaxy (HVPE) to form a gallium nitride layer of about 100 microns thickness. Next, the sapphire substrate was removed by polishing to obtain a gallium nitride article of about 80 microns thickness. Finally, an InGaN MQW LD structure was grown by MOVPE.

Ogawa et al. U.S. Pat. No. 6,455,877 discloses growth of light emitting devices on gallium nitride substrate formed by HVPE deposition of gallium nitride on ELOG gallium nitride formed by MOVPE on sapphire, wherein the sapphire was polished away after formation of sufficient gallium nitride thickness. Ogawa et al. describes a preferred substrate orientation of 0.10 to 0.25 degree tilt away from the c-plane of the gallium nitride material. In subsequent U.S. Published patent application No. 2001/0030329, Ueta, et al. state a preference for a substrate orientation of 0.05-2 degrees tilted away from the c-plane of the gallium nitride material. In these various device structures, the device layer was grown by MOVPE directly on the as-grown HVPE gallium nitride surface.

SUMMMARY OF THE INVENTION

The present invention relates to vicinal III-V nitride substrates, e.g., gallium nitride substrates, having suitability for high quality homoepitaxial fabrication of microelectronic and opto-electronic device structures.

In one aspect, the present invention relates to a GaN substrate including a GaN (0001) surface offcut from the <0001> direction predominantly towards a direction selected from the group consisting of <10$\bar{1}$0> and <11$\bar{2}$0> directions, at an offcut angle in a range that is from about 0.2 to about 10 degrees, wherein said surface has a RMS roughness measured by 50×50 μm AFM scan that is less than 1 nm, and a dislocation density that is less than 3E6 $cm^{-2}$.

A further aspect of the invention relates to a method of forming a GaN substrate including a GaN (0001) surface offcut from the <0001> direction predominantly towards a direction selected from the group consisting of <10$\bar{1}$0> and <11$\bar{2}$0> directions, at an offcut angle in a range that is from about 0.2 to about 10 degrees, wherein the surface has a RMS roughness measured by 50×50 $μm^2$ AFM scan that is less than 1 nm, and a dislocation density that is less than 3E6 $cm^{-2}$. The method to synthesize such wafers includes growing a bulk GaN single crystal body, and processing the bulk GaN single crystal body to form at least one wafer therefrom, wherein the processing step includes a step selected from the group consisting of: (i) a slicing step conducted in a slicing plane tilted away from the c-plane at the offcut angle predominantly towards the direction selected from the group consisting of <10$\bar{1}$0> and <11$\bar{2}$0> directions, (ii) an angle lapping step conducted in a lapping plane tilted away from the c-plane at the offcut angle predominantly towards the direction selected from the group consisting of <10$\bar{1}$0> and <11$\bar{2}$0> directions, and (iii) separating the bulk GaN single crystal body after growing the bulk GaN single crystal body on a vicinal heteroepitaxial substrate including a (0001) surface offcut from the <0001> direction predominantly towards a direction selected from the group consisting of <10$\bar{1}$0> and <11$\bar{2}$0> directions, at an offcut angle in the range of from about 0.2 to about 10 degrees.

In another aspect, the invention relates to a method of fabricating a microelectronic or opto-electronic device, including:

(a) forming a GaN substrate including a GaN (0001) surface offcut from the <0001> direction predominantly towards a direction selected from the group consisting of <10$\bar{1}$0> and <11$\bar{2}$0> directions, at an offcut angle in a range that is from about 0.2 to about 10 degrees, wherein the surface has a RMS roughness measured by 50×50 µm AFM scan that is less than 1 nm, and a dislocation density that is less than 3E6 cm$^{-2}$, such method including growing a bulk GaN single crystal body, and processing the bulk GaN single crystal body to form at least one wafer therefrom, wherein the processing step includes a step selected from the group consisting of: (i) a slicing step conducted in a slicing plane tilted away from the c-plane at the offcut angle predominantly towards the direction selected from the group consisting of <10$\bar{1}$0> and <11$\bar{2}$0> directions, (ii) an angle lapping step conducted in a lapping plane tilted away from the c-plane at the offcut angle predominantly towards the direction selected from the group consisting of <10$\bar{1}$0> and <11$\bar{2}$0> directions, and (iii) separating the bulk GaN single crystal body after growing the bulk GaN single crystal body on a vicinal heteroepitaxial substrate including a (0001) surface offcut from the <0001> direction predominantly towards a direction selected from the group consisting of <10$\bar{1}$0> and <11$\bar{2}$0> directions, at an offcut angle in the range of from about 0.2 to about 10 degrees, and (b) depositing on the GaN substrate a homoepitaxial III-V nitride material, e.g., GaN.

Other aspects, features and embodiments of the present invention will be more fully apparent from the ensuing disclosure and appended claims.

BRIEF DESCRIPTION OF THE DRAWINGS

FIG. 9 is a 10×10 µm$^2$ AFM image of a CMP finished vicinal GaN (0001) wafer with 8 degree offcut towards the <11$\bar{2}$0> direction.

FIGS. 10A and 10B schematically show angle lapping of wafers, with FIG. 10A showing the wafer placed in an angle lapping fixture, and FIG. 10B showing the wafer after lapping a wedge on the wafer.

DETAILED DESCRIPTION OF THE INVENTION, AND PREFERRED EMBODIMENTS THEREOF

Although the ensuing discussion herein is directed primarily to GaN as an illustrative III-V nitride species for application of the present invention, it will be recognized that the invention is broadly applicable to III-V nitride compounds, including binary compounds and alloys. As used herein, the term "III-V nitride" refers to semiconductor material including nitrogen and at least one of Al, In and Ga. Such III-V nitride material may be denoted symbolically as (Al,In,Ga)N. The term (Al,In,Ga)N includes all permutations of nitrides including one or more of Al, In and Ga, and thus encompasses as alternative materials AlN, InN, GaN, AlInN, AlGaN, InGaN and AlInGaN, wherein the stoichiometric coefficients of Al, In, and Ga in compounds containing two, or all three, of such metals may have any appropriate values between 0 and 1 with the proviso that the sum of all such stoichiometric coefficients is 1. In this respect, impurities such as hydrogen or carbon, dopants, or strain-altering materials such as boron can also be incorporated in the (Al,In,Ga)N material, but the sum of all stoichiometric coefficients is 1 within a variation of ±0.1%. Examples of such compounds include $Al_xGa_{1-x}N$ wherein $0 \leq x \leq 1$, and $Al_xIn_yGa_{1-x-y}N$ wherein $0 \leq x \leq 1$ and $0 \leq y \leq 1$. Thus, although the ensuing discussion is directed to GaN as an illustrative material, other III-V nitride materials may likewise be employed in the high quality substrates of the invention. As background to the subsequent disclosure of the method and vicinal substrates of the invention, the following description is directed to a series of experiments that were conducted to show the deficiencies of homoepitaxial growth of gallium nitride by metal-organic vapor phase epitaxy (MOVPE) on c-plane surfaces of various large area substrates.

In one set of experiments, a MOVPE gallium nitride film was grown in the same growth run on nominally c-plane freestanding GaN wafer and on a template made of heteroepitaxial MOVPE GaN film on sapphire. Since the surface of the GaN/sapphire template was gallium nitride, MOVPE growth conditions optimized for the heteroepitaxial growth of gallium nitride on sapphire were used without a low temperature buffer layer.

It was expected in these experiments that the homoepitaxial GaN film on the GaN wafer would be superior to the pseudo-homoepitaxial film on the GaN/sapphire template. Surprisingly, the homoepitaxial film on the GaN wafer was rougher than the GaN film on the GaN/sapphire template.

Figure 1:
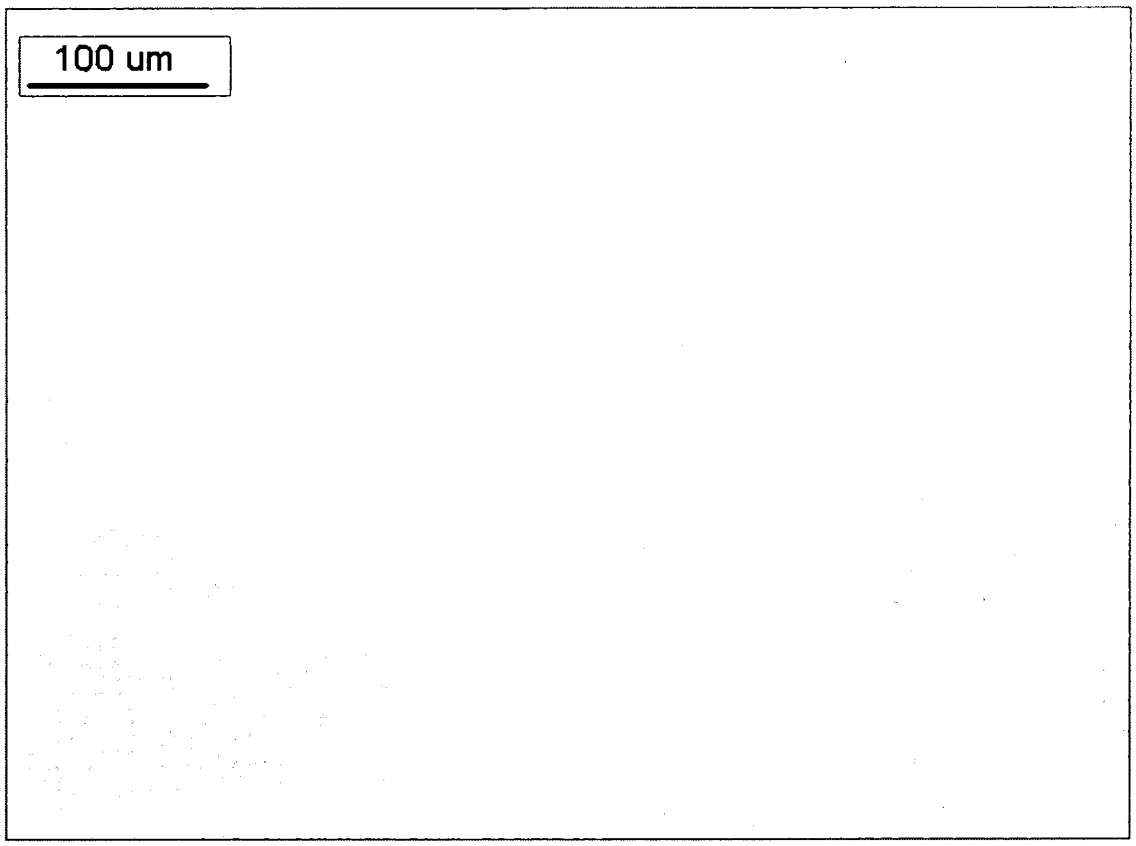
FIG. 1 is a differential interference contrast (DIC) microscope image of the surface of an MOVPE homoepitaxial film grown on an MOVPE GaN/sapphire template. The growth conditions included growth temperature of 1220° C. and growth rate of 4 µm/hr.
Figure 2:
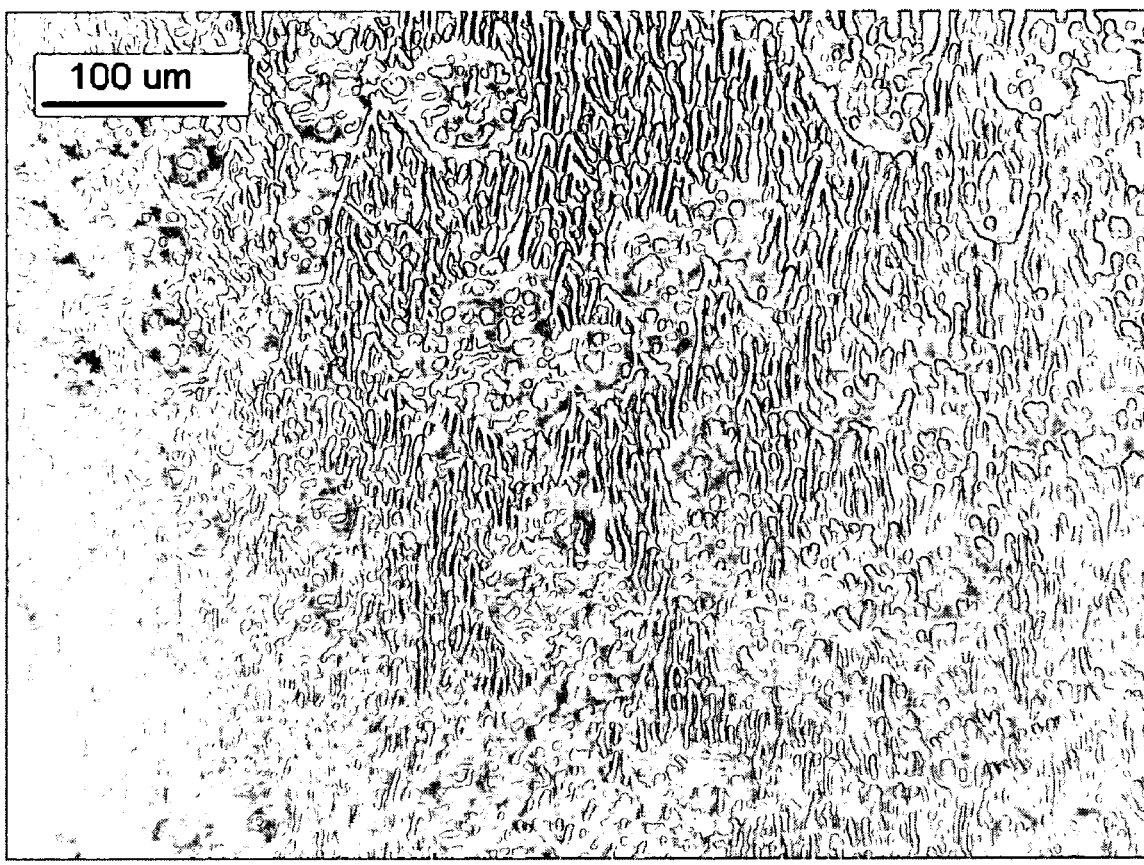
FIG. 2 is a DIC microscope image of the MOVPE homoepitaxial GaN film on the GaN wafer. The growth conditions included growth temperature of 1220° C. and growth rate of 4 µm/hr.

FIG. 1 is a differential interference contrast (DIC) microscope image of the surface of the homoepitaxial film grown on the GaN/sapphire template. FIG. 2 is the DIC microscope image of the homoepitaxial GaN film on the GaN wafer. Both films were grown in one growth run, at a growth temperature of 1220° C. and a growth rate of 4 µm/hr. The temperature during the growth process was measured with a thermocouple placed under the susceptor, in consequence of which the actual wafer surface temperature was likely ~100-150° C. lower than the thermocouple reading. The homoepitaxial film on the GaN/sapphire template was smooth and featureless, while the homoepitaxial film on the GaN wafer was very rough and exhibited three-dimensional growth features.

Figure 3:
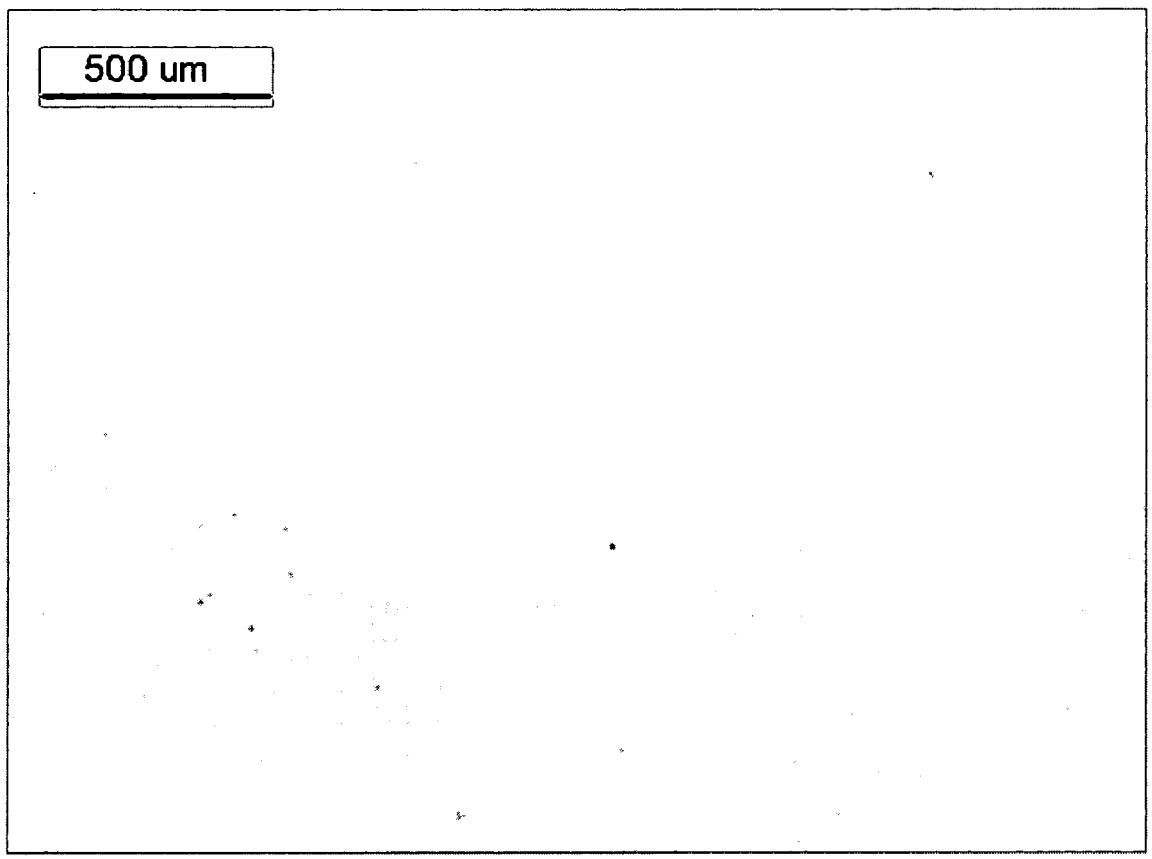
FIG. 3 is a DIC microscope image of a 2 µm thick homoepitaxial GaN film on the GaN wafer, from the perimeter of the wafer. The growth conditions included growth temperature of 1170° C. and growth rate of 2 µm/hr.

The surface morphology of the homoepitaxial GaN film on the GaN substrate was determined to be susceptible to substantial improvement, by optimizing the growth conditions for forming homoepitaxial GaN on the GaN substrate. Experiments were conducted in which the growth rate, growth temperature, ammonia flow, and growth pressure were varied. It was found that by reducing the growth rate from 4 µm/hr to 2 µm/hr, the surface morphology was significantly improved. At a growth rate of 2 µm/hr, the surface morphology of the homoepitaxial film on the GaN substrate was further improved by reducing the growth temperature from 1220° C. to 1170° C. or even lower. It was also found that the surface morphology could be improved by increasing $NH_3$ flow rate or by increasing the growth pressure. The optimal growth conditions depend on the reactor geometry and interrelated growth parameters. By systematically varying the growth conditions in the reactor, homoepitaxial GaN film on the nominally c-plane GaN wafer with smooth surface morphology was achieved. FIG. 3 shows a DIC microscope image of a 2 µm thick homoepitaxial GaN film on a nominally c-plane GaN wafer. The surface was very smooth and almost featureless.

However, it was found that even under optimal growth conditions, the surface morphology of the homoepitaxial films on nominally c-plane GaN wafers were not uniform. There were at least two types of surface morphology, viz., smooth surface of the character shown in FIG. 3, and hillock surface morphology.

Figure 4:
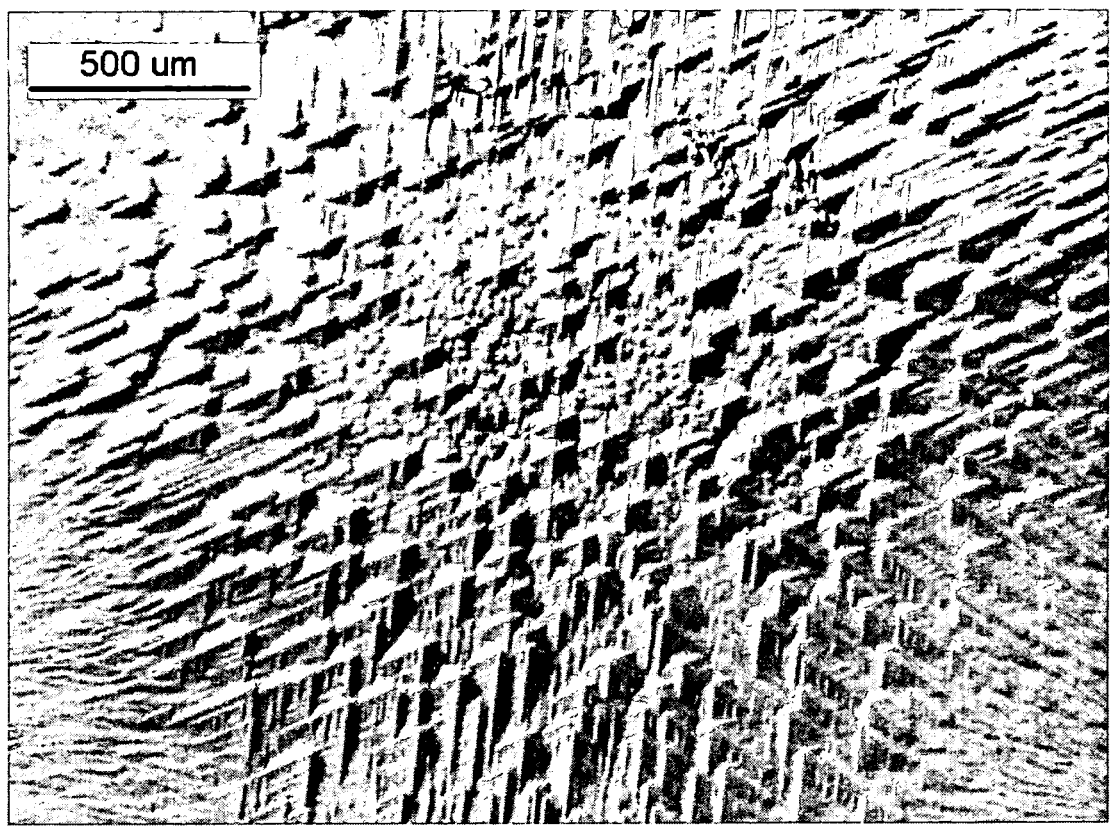
FIG. 4 is a DIC microscope image of the 2 µm thick homoepitaxial GaN film on the GaN wafer. The image was from the same wafer as shown in FIG. 3, but was taken from a near center position on the wafer. The growth conditions included growth temperature of 1170° C. and growth rate of 2 µm/hr.

FIG. 4 shows hillock surface morphology of the homoepitaxial GaN film on a nominally c-plane GaN wafer. The hillock surface morphology was typically located near the center of the wafer and the smoother surface morphology was typically near the outer margins of the wafer.

The non-uniformity of the surface morphology was determined to be related to the crystal orientation of the surface. Due to the presence of the residual stress in the gallium nitride wafer blank prior to wafer polish, the c-plane GaN wafer blank had lattice curvature, i.e., the c-plane of the crystalline material was not flat, but rather was bowed. During formation of epitaxy-ready GaN wafer by mechanical lapping, polishing and chemical mechanical polishing, the wafer surface can be made mechanically flat, but the lattice curvature may still be present, so that only a specific surface area, typically near the wafer center, has the c-plane parallel to the surface. The majority of the surface area, toward the outer margins of the wafer, has the c-plane slightly tilted away from the surface. The slight tilt of the surface away from the c-plane is typically less than 1 degree for the nominally c-plane GaN wafer.

The hexagonal hillock morphology of the homoepitaxial film that was observed on the nominally c-plane GaN wafer was associated with a surface area that was exactly parallel to the c-plane. The formation of the hexagonal hillock structure on the exact c-plane substrate was attributable to a low density of crystalline steps on the exact c-plane surface, which made smooth two-dimensional growth difficult. By the formation of hexagonal hillocks, crystalline steps were created so that the local surface plane was no longer an exact c-plane. The crystalline steps created nucleation centers for the growing film, allowing incoming atoms from the gas phase to settle along the steps.

For the GaN wafer with a distribution of surface angles with respect to the crystalline c-plane there was a distribution of surface step widths and step directions. On the exact c-plane substrate, hexagonal hillocks were symmetric. When moving slightly away from the exact c-plane to a slight vicinal angle, i.e., offcut angle, defined as the angle between the lattice c-plane and the local surface (vicinal and offcut being used interchangeably herein), one side of the hexagonal hillock structure was enlarged at the expense of the opposite side, as can be seen in FIG. 4. When the vicinal angle was sufficiently large, the hillock morphology disappeared.

Surface microstructures of homoepitaxial GaN films on GaN substrates were examined by atomic force microscope (AFM). The non-uniform surface morphology observed in the DIC optical microscope was also present in the microstructure observed in the AFM images.

Figure 5:
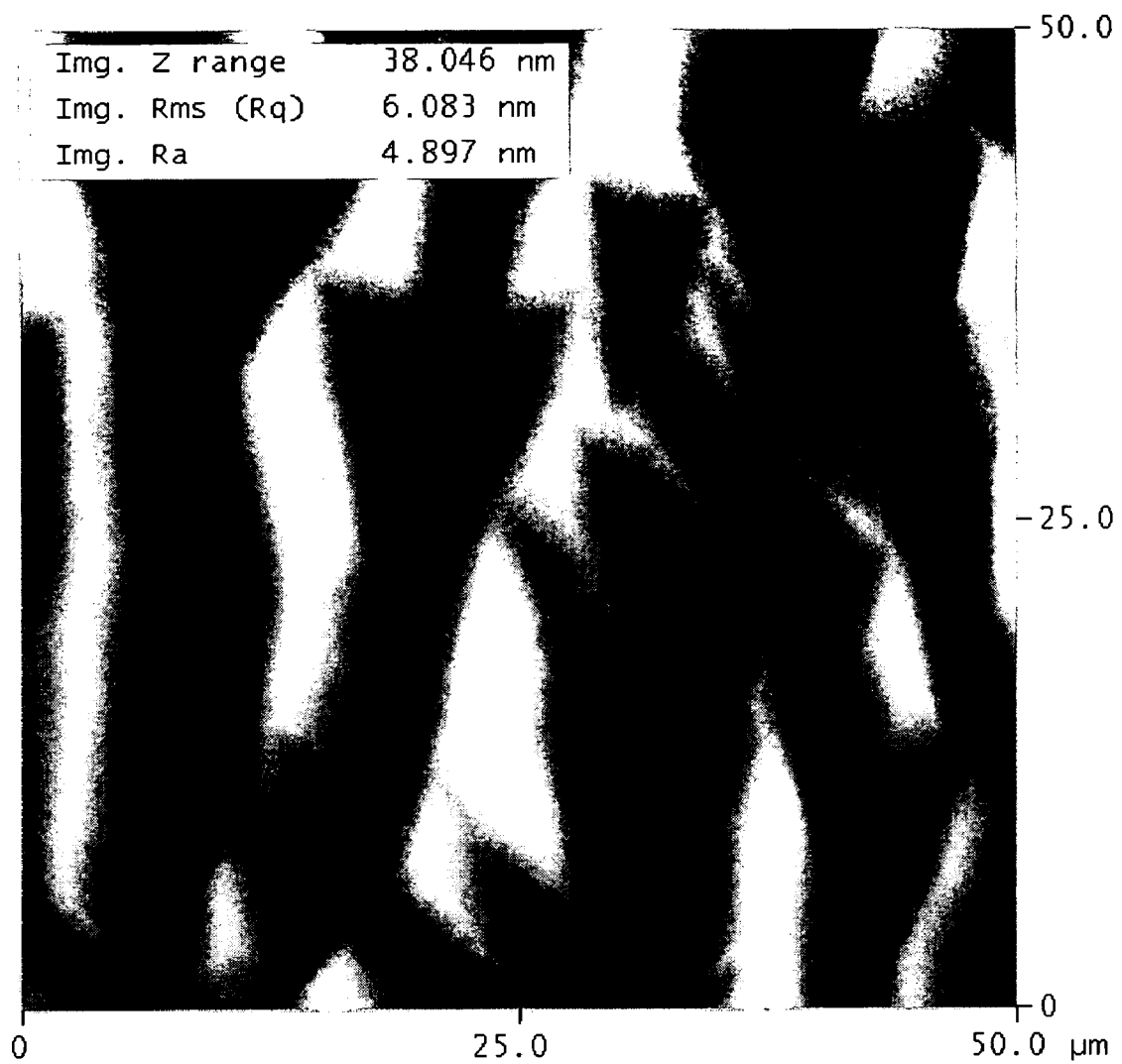
FIG. 5 is a 50×50 µm$^2$ AFM image for the homoepitaxial GaN film on the GaN wafer, taken near the area with the morphology shown in FIG. 4.
Figure 6:
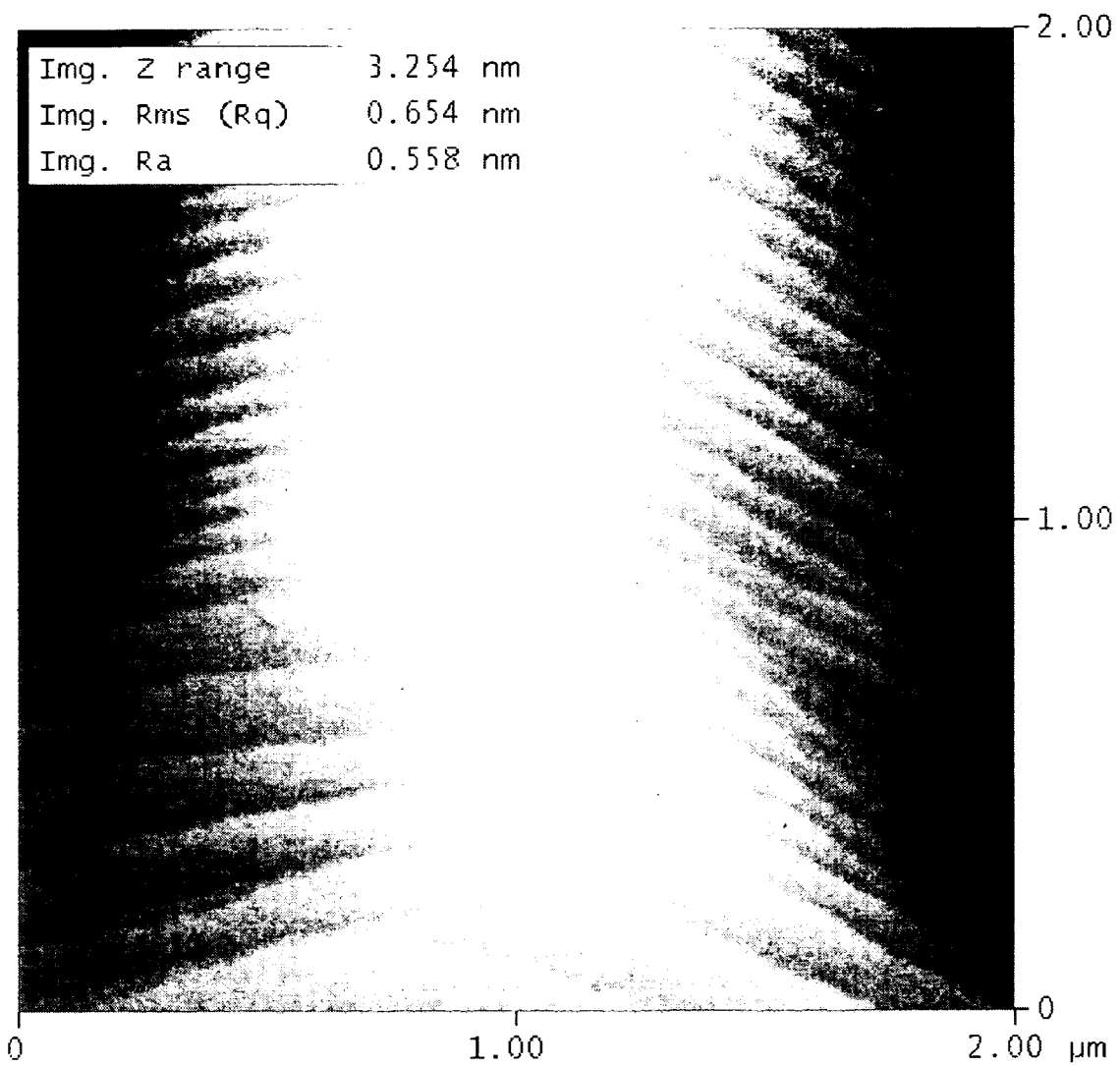
FIG. 6 is a 2×2 µm$^2$ AFM image for the homoepitaxial GaN film on the GaN wafer in the hillock area, taken near the area with the morphology shown in FIG. 4.

In the surface area with a hillock surface morphology, the surface microstructure appeared to be faceted, as shown in the 50×50 µm² AFM image of FIG. 5. FIG. 6 is a 2×2 µm² AFM scan showing further details of the microstructure. Atomic step structure was visible. The widths between the atomic steps in the area with hillock morphology on the homoepitaxial film, typically were between about 100 nm and about 300 nm. Based on such atomic step width and assuming single bilayer step heights, it was determined that the local surface was from about 0.2 degrees away from the lattice c-plane, i.e., the 2 μm thick homoepitaxial film on the exact c-plane GaN substrate developed a surface offcut with respect to the lattice c-plane that was about 0.2 degrees.

Figure 7:
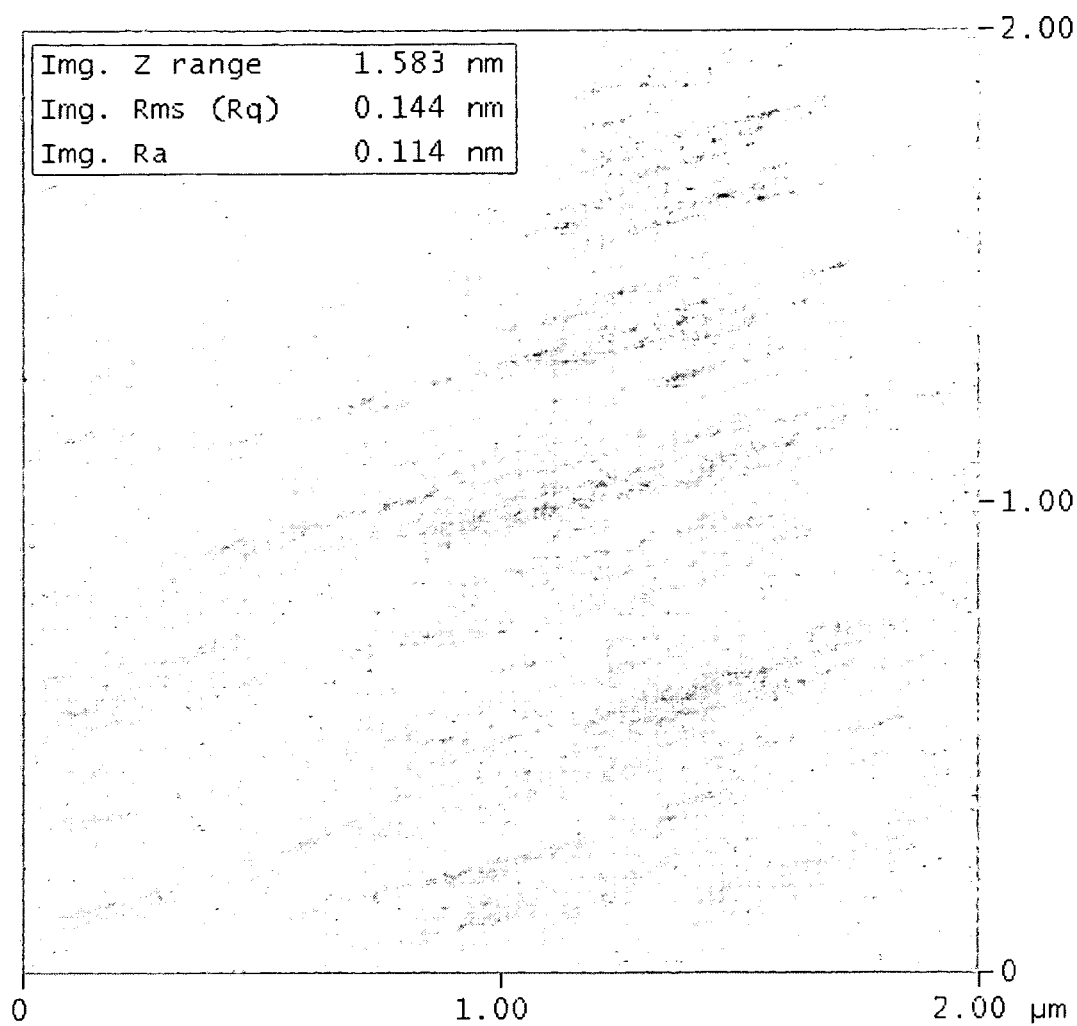
FIG. 7 is a 2×2 µm$^2$ AFM image for the homoepitaxial GaN film on the GaN wafer in the smooth area, taken near the area with the morphology shown in FIG. 3.

Away from the center hillock region, the homoepitaxial film was very smooth, as shown FIG. 3. AFM imaging also showed smooth microstructure. FIG. 7 is a 2×2 μm² AFM image of a 2 μm thick homoepitaxial GaN film on a GaN wafer. The AFM image was acquired in the area with a surface morphology of the character shown in FIG. 3. FIGS. 3 to 7 are images obtained from one homoepitaxial film on a GaN wafer, but in different areas of the film. The surface roughness as measured by root-mean square (RMS) technique was 0.14 nm over 2×2 μm² AFM image, demonstrating extreme smoothness of the homoepitaxial film surface.

Non-uniform surface morphologies of homoepitaxial films on large-area GaN wafers cause non-uniform device properties and yield loss, in consequence of which there has been a compelling need in the art for improvements in GaN technology that enables reliable and commercially reproducible production of uniformly smooth and high quality homoepitaxial GaN films on GaN substrates.

The issues associated with non-uniform surface morphology of homoepitaxial films on GaN substrates and the occurrence of rough hillock surface features in the production of GaN films are obviated by the GaN wafer articles of the present invention, having surfaces intentionally tilted away from the lattice c-plane, i.e., wafers with vicinal c-plane surface or with offcut surfaces, on which homoepitaxial growth may be carried out to produce high quality smooth homoepitaxial films of GaN.

By way of reference, the c-plane of the GaN crystal is designated as (0001) plane, and the direction of the c-plane is the c-axis [0001] direction. When reference is made to (0001) plane, the gallium-terminated c-plane is meant, whereas the (000$\bar{1}$) plane refers to the nitrogen-terminated c-plane. The direction of a surface or plane is defined as the direction normal to the surface. When the surface direction of a vicinal wafer is the plane defined by <0001> and <11$\bar{2}$0> directions, the surface is referred to as a (0001) surface offcut towards <11$\bar{2}$0> direction. Because of the symmetry of the GaN crystal, the <10$\bar{1}$0> direction is a general expression of a group of directions including [10$\bar{1}$0], [$\bar{1}$010], [1$\bar{1}$00], [$\bar{1}$100], [01$\bar{1}$0] and [0$\bar{1}$10]. The <11$\bar{2}$0> direction is a general expression of a group of directions including [11$\bar{2}$0], [$\bar{1}\bar{1}$20], [1$\bar{2}$10], [$\bar{1}$2$\bar{1}$0], [$\bar{2}$110] and [2$\bar{1}\bar{1}$0]. As used herein, the term "predominantly towards" in reference to a specified direction, e.g., the <10$\bar{1}$0> direction or <11$\bar{2}$0> direction, means towards such direction ±15 degrees. It should be borne in mind that such reference refers to an azimuthal tolerance angle, in contrast to references herein to a polar (offcut) angle. Preferably, the azimuthal variation towards the specified direction is ±5 degrees, and most preferably, such variation is ±2 degrees.

The present invention contemplates a GaN substrate including a GaN (0001) surface offcut from the [0001] direction predominantly towards a direction selected from the group consisting of <10$\bar{1}$0> and <11$\bar{2}$0> directions, at an offcut angle in a range that is from about 0.2 to about 10 degrees, wherein the surface has a RMS roughness measured by 50×50 μm² AFM scan that is less than 1 nm, and a dislocation density that is less than 3E6 cm$^{-2}$.

The GaN (0001) surface in specific embodiments may be offcut toward the <10$\bar{1}$0> direction or the <11$\bar{2}$0> direction, at an offcut angle in a range of from about 0.2 to about 10 degrees, or at an offcut angle in a range of from about 0.2 to about 4 degrees, or at an offcut angle in a range of from about 3 to about 8 degrees, or at an offcut angle in a range of from about 5 to about 8 degrees, or at an offcut angle in a range of from about 2.5 to about 10 degrees, or at an offcut angle in a range of from about 2.5 to 8 degrees, or at an offcut angle in a range of from about 2.5 to about 4, as may be variously be appropriate in a given application of the invention.

In specific embodiments, the offcut surface may have a RMS roughness measured by 50×50 μm² AFM scan that is less than 0.9 nm, or more preferably a RMS roughness measured by 50×50 μm² AFM scan that is less than 0.5 nm. In preferred aspects, the dislocation density of the GaN substrate is less than 1E6 cm$^{-2}$, and more preferably less than 5E5 cm$^{-2}$.

The GaN substrates of the invention are usefully employed for fabricating microelectronic or opto-electronic devices and device structures, involving deposition of homoepitaxial GaN on the substrate, e.g., as a component step in a multistep fabrication process involving additional deposition of AlGaN on the homoepitaxially deposited GaN on the GaN substrate, to form an AlGaN/GaN HEMT structure. The device fabricated on the GaN substrate alternatively may comprise a blue or shorter wavelength laser diode.

The deposition of homoepitaxial GaN or other III-V nitride material on the GaN substrate may be carried out using any suitable deposition technique, e.g., MOVPE, and the deposition process may be carried out at any suitable process conditions. For example, the deposition of homoepitaxial III-V nitride material can be carried out at temperature in a range of from about 700 to about 1220° C., or alternatively in a range of from about 1120 to about 1170° C., or alternatively in a range of from about 1100 to about 1225° C., depending on the specific application, and the growth rate of the homoepitaxial GaN or other III-V nitride material on the GaN substrate can be at a rate in a range of from about 0.1 μm/hr to about 50 μm/hr, or alternatively in a range of from about 1 μm/hr to about 50 μm/hr, or alternatively in a range of from about 1 μm/hr to about 4 μm/hr, or alternatively in a range of from about 1 μm/hr to about 2 μm/hr.

Offcut wafers in accordance with the invention can be produced by several methods. When a long GaN boule is available, the boule can be oriented and sliced to produce wafers with offcut angle with respect to the c-plane. When a relatively thick c-plane GaN wafer blank is available, the GaN wafer blank can first be angle-lapped, which involves placing the wafer in a fixture with a predetermined angle with respect to the lapping plate, and lapping the wafer to produce a wedge conformation of the wafer. The wedged wafer then is lapped on the backside to remove the wedge conformation and yield a wafer with the surface tilted away from the lattice c-plane. Vicinal GaN can also be grown on a vicinal template, such as sapphire, that is removed after deposition of the vicinal GaN material, to yield a freestanding vicinal GaN substrate article.

In one illustrative embodiment of the invention, a GaN boule was grown by a hybride vapor phase epitaxy (HVPE) process to a thickness of about 1 centimeter. The GaN boule was oriented with a goniometer so that during slicing with a wire saw, the slicing plane was tilted 8 degrees away from the c-plane in the <10$\bar{1}$0> direction. The boule was subsequently sliced into multiple wafer blanks with 8 degree offcut towards the <10$\bar{1}$0> direction.

In another embodiment of the invention, a GaN boule was grown by an HVPE process to a thickness of about 1 centimeter. The GaN boule was oriented with a goniometer so that during slicing with a wire saw, the slicing plane was tilted 8 degrees away from the c-plane in the <11$\bar{2}$0> direction. The boule was subsequently sliced into multiple wafer blanks with 8 degree offcut towards <11$\bar{2}$0>.

In yet another embodiment of the invention, a GaN boule was grown by an HVPE process to a thickness of about 1 centimeter. The GaN boule was oriented with a goniometer so that during slicing with a wire saw, the slicing plane was tilted 4 degrees away from the c-plane in the <10$\bar{1}$0> direction. The boule was subsequently sliced into multiple wafer blanks with 4 degree offcut towards <10$\bar{1}$0>.

In still another embodiment of the invention, a GaN boule was grown by an HVPE process to a thickness of about 1 centimeter. The GaN boule was oriented with a goniometer so that during slicing with a wire saw, the slicing plane was tilted 4 degrees away from the c-plane in the <11$\bar{2}$0> direction. The boule was subsequently sliced into multiple wafer blanks with 4 degree offcut towards <11$\bar{2}$0>.

In a further embodiment of the invention, a GaN boule was grown by an HVPE process to a thickness of about 1 centimeter. The GaN boule was oriented with a goniometer so that during slicing with a wire saw, the slicing plane was tilted 2 degrees away from the c-plane in the <10$\bar{1}$0> direction. The boule was subsequently sliced into multiple wafer blanks with 2 degree offcut towards <10$\bar{1}$0>.

In another embodiment of the invention, a GaN boule was grown by an HVPE process to a thickness of about 1 centimeter. The GaN boule was oriented with a goniometer so that during slicing with a wire saw, the slicing plane was tilted 2 degrees away from the c-plane in the <11$\bar{2}$0> direction. The boule was subsequently sliced into multiple wafer blanks with 2 degree offcut towards <11$\bar{2}$0>.

The sliced vicinal wafer blanks produced as described above then were lapped with a 9-micron particle size diamond slurry on both sides to remove saw damage. A c-plane GaN wafer has two surfaces, one terminated with nitrogen and referred to as the nitrogen-terminated (000$\bar{1}$) surface, and the other surface terminated with gallium and referred to as the gallium-terminated (0001) surface. The offcut GaN (0001) wafers also have two surfaces. One surface is vicinal to the (0001) surface, and is still termed a gallium-terminated surface, although the vicinal (0001) surface has atomic steps that expose a small portion of nitrogen atoms to the surface.

After lapping both sides of the vicinal wafers described in the above-referenced embodiments, the gallium-sides of the wafers were further polished with smaller grit diamond slurry until mirror finishes were obtained. The nitrogen-sides optionally can also be polished to a mirror finish. The diamond polished surfaces still contained surface and subsurface damage from the polish operation.

A chemical mechanical polish (CMP) process then was used as the final polish step to remove remaining surface damage from the gallium-terminated surface, the surface for subsequent homoepitaxial growth. In general, the CMP process may be carried in any suitable manner and with any appropriate CMP formulation. The CMP process was effective in removing scratches and surface damage.

Figure 8:
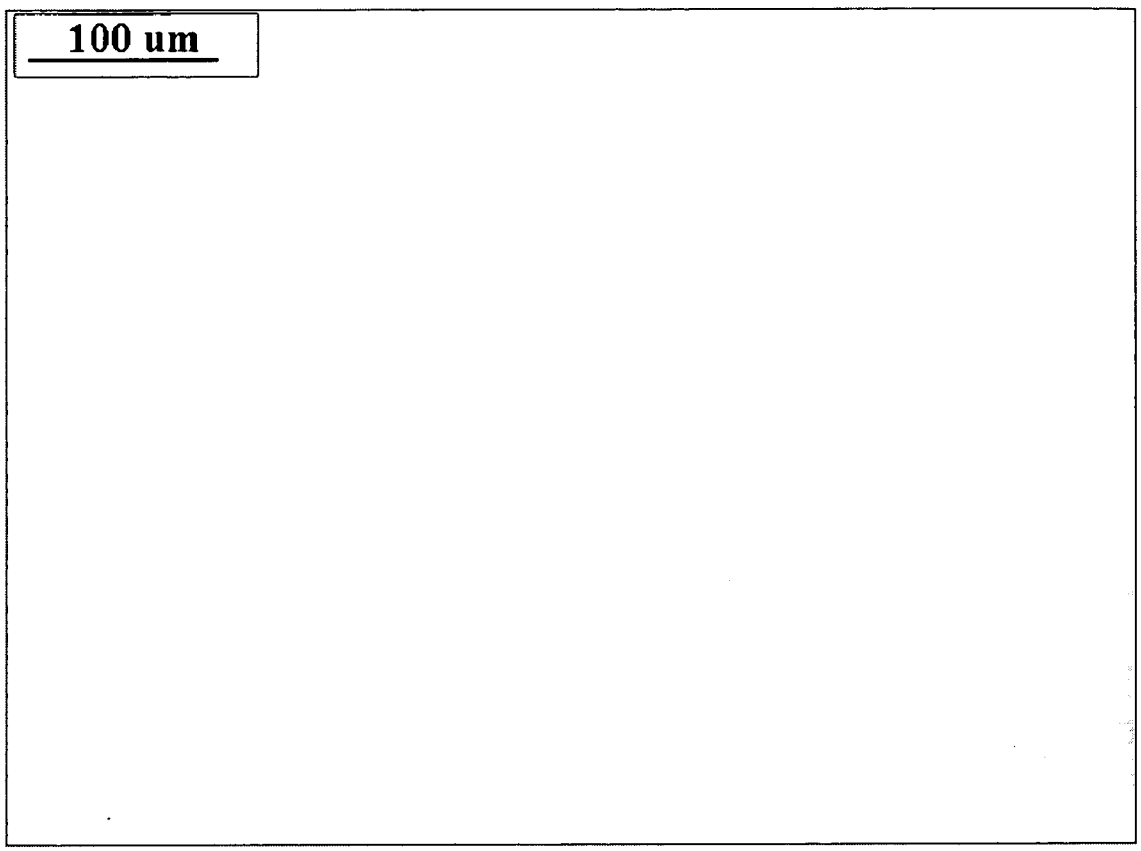
FIG. 8 is a DIC optical image of a CMP finished vicinal GaN (0001) wafer with nominally 8 degree offcut towards the <10$\bar{1}$0> direction.

FIG. 8 is a DIC optical image of a CMP finished vicinal GaN (0001) wafer with 8 degree offcut towards <10$\bar{1}$0> direction. FIG. 9 is a 50×50 µm$^2$ AFM image of a CMP finished vicinal GaN (0001) wafer with 8 degree offcut towards the <11$\bar{2}$0> direction. The 8 degree offcut wafers after CMP exhibited step structures as shown in FIGS. 8 and 9.

Vicinal GaN wafers can also be produced by angle lapping. FIG. 10 is a schematic of an angle lapping process flow for forming a vicinal GaN substrate from a nominally c-plane wafer blank. In FIG. 10A, the c-plane wafer blank is placed in a pocket of a fixture with a predetermined tilt at the bottom of the pocket. The wafer in the pocket is lapped on a lapping plate so that after lapping the top of the wafer surface is parallel to the top of the fixture, i.e., the wafer shape is a wedge and the wafer top surface is at a vicinal angle with respect to the c-plane of the GaN, as shown in FIG. 10B. After the formation of the wedge conformation, the wedged wafer is placed in a fixture and lapped so that the two surfaces of the wafer are parallel to each other, and they have the same magnitude offcut.

In an illustrative embodiment, a GaN wafer blank with a thickness of about 1.3 mm was formed by HVPE growth on c-plane sapphire and the sapphire then was removed. The wafer blank was subsequently angle lapped to produce a 1 degree offcut towards the <10$\bar{1}$0> direction.

In another embodiment, a GaN wafer blank with a thickness of about 1.3 mm was formed by HVPE growth on c-plane sapphire and the sapphire was removed. The wafer blank was subsequently angle lapped to produce a 1 degree offcut towards the <11$\bar{2}$0> direction.

In a further embodiment, a GaN wafer blank with a thickness of about 1.3 mm was formed by HVPE growth on c-plane sapphire and the sapphire was removed. The wafer blank was subsequently angle lapped to produce a 2 degree offcut towards the <10$\bar{1}$0> direction.

In yet another embodiment, a GaN wafer blank with a thickness of about 1.3 mm was formed by HVPE growth on c-plane sapphire and the sapphire was removed. The wafer blank was subsequently angle lapped to produce a 2 degree offcut towards the <11$\bar{2}$0> direction.

In a still further embodiment, a GaN wafer blank with a thickness of about 1.3 mm was formed by HVPE growth on c-plane sapphire. The wafer blank was subsequently angle lapped to produce a 1 degree offcut towards a direction intermediate between <10$\bar{1}$0> and <11$\bar{2}$0>.

The angle lapped vicinal GaN wafers produced as described above were further polished at the gallium-terminated surface with smaller diamond grit to produce a mirror finish. It will be appreciated that the nitrogen-side optionally can be polished to a mirror finish. Subsequently, the gallium-side of the wafers was chemical mechanically polished to remove surface scratches and subsurface damage.

Figure 11:
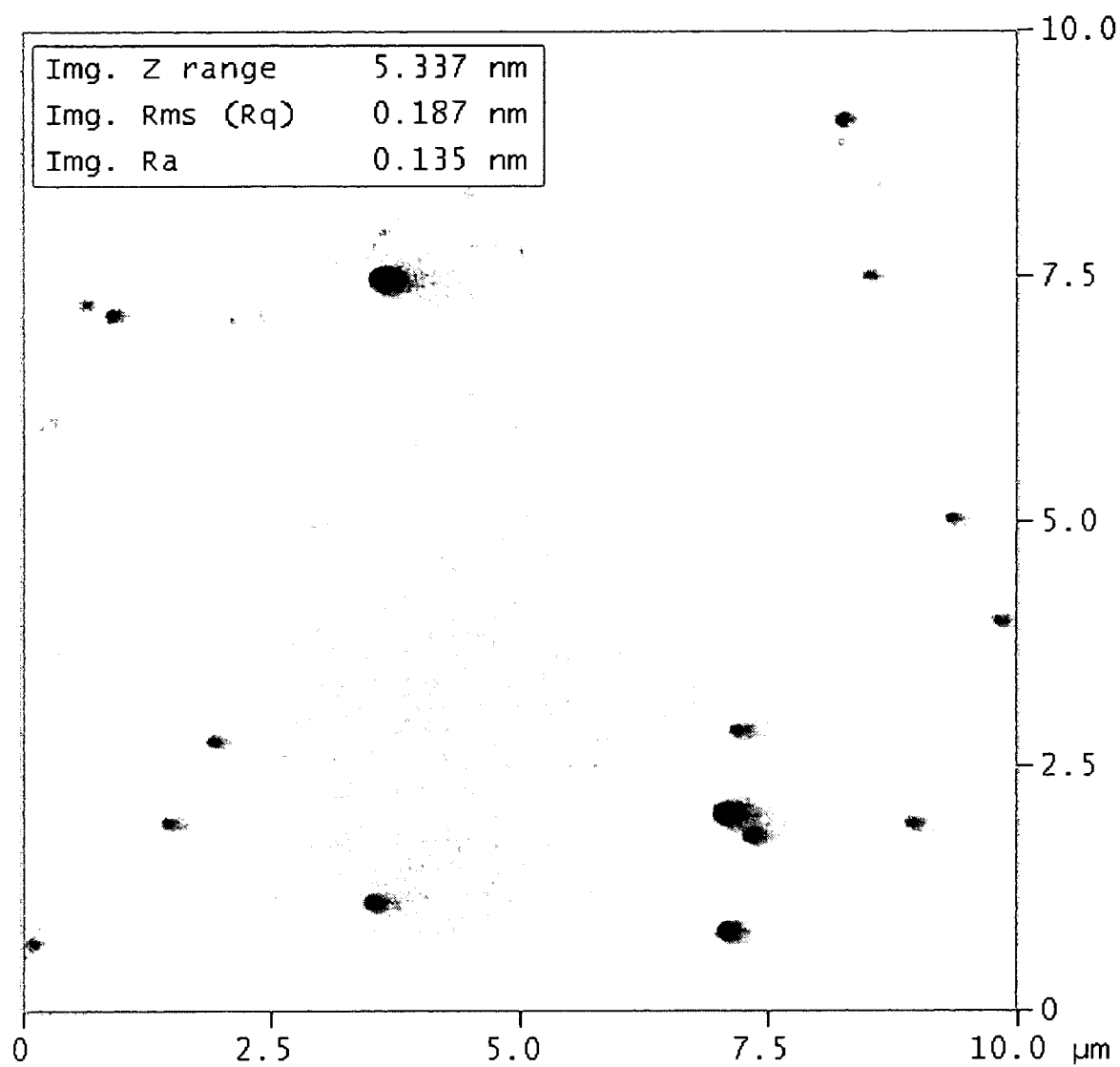
FIG. 11 is a 10×10 µm$^2$ AFM image of a CMP finished angle lapped GaN (0001) surface with 2 degree offcut towards the <10$\bar{1}$0> direction.

FIG. 11 is an AFM image of a representative CMP finished angle lapped GaN (0001) surface, with a 2 degree offcut towards <10$\bar{1}$0>. The surface was very smooth (the pits in the image were associated with threading dislocations).

Vicinal GaN can be grown in accordance with the invention on vicinal sapphire substrates. In one illustrative embodiment, a c-plane sapphire substrate with a 1 degree offcut towards <10$\bar{1}$0> direction was used and an HVPE GaN film was grown on the substrate. X-ray diffraction measurement confirmed that the GaN film also had a 1 degree off-cut towards <11$\bar{2}$0> direction. In another illustrative embodiment, HVPE GaN was grown on a c-plane sapphire substrate with a 2 degree offcut towards the <10$\bar{1}$0> direction. X-ray diffraction measurement confirmed the GaN film as being 2 degree offcut towards the <11$\bar{2}$0> direction.

In yet another illustrative embodiment, GaN film was grown by HVPE technique on a vicinal c-plane sapphire substrate with a 4 degree offcut towards the <10$\bar{1}$0> direction. X-ray diffraction confirmed the GaN film as vicinal with a 4 degree offcut towards the <11$\bar{2}$0> direction.

Vicinal GaN substrates in accordance with the invention can be prepared by growing a relatively thick GaN film on a vicinal substrate formed of any suitable material that enables offcut GaN growth. The vicinal substrate for such purpose may for example be formed of sapphire, gallium arsenide, silicon, or other appropriate material. As a further specific example, the offcut GaN growth may be carried out on a vicinal sapphire substrate involving HVPE deposition of GaN.

After growing a relatively thick GaN film on a vicinal foreign substrate, the foreign substrate can be removed by any suitable means or method. For example, the substrate removal may involve elimination of the substrate, removal of part or all of the substrate, or removal of all of the substrate and part of the GaN adjacent to the substrate. Specific techniques that may usefully be employed for such purpose include mechanical grinding, chemical etching, interfacial decomposition, interfacial fracturing, or any other means or method appropriate to the particular substrate. After removing the foreign substrate, the resulting GaN wafer blank can be lapped, polished, and chemical mechanically polished as described hereinabove, to yield an epitaxy-ready vicinal GaN substrate.

Low defect density vicinal GaN substrates in accordance with the invention can be produced by slicing low defect density GaN ingots, or angle lapping a low defect density GaN wafer blank, or lapping and polishing a vicinal GaN wafer blank if the low defect GaN material is grown on a vicinal foreign substrate. A two-stage growth process, as disclosed in our co-pending United States Patent Application filed on date herewith in the names of Xueping Xu and Robert P. Vaudo for "LARGE AREA, UNIFORMLY LOW DISLOCATION DENSITY GaN SUBSTRATE AND PROCESS FOR MAKING THE SAME," may be advantageously used to produce such GaN material with low dislocation density. The disclosure of the co-pending United States Patent Application is hereby incorporated herein by reference in its entirety. The dislocation density of the low dislocation density GaN preferably is lower than 3E6 cm$^{-2}$, more preferably less than 1E6 cm$^{-2}$, and most preferably less than 5E5 cm$^{-2}$.

The gallium-side of vicinal GaN substrates in accordance with the invention can be finished with chemical mechanical polish processing for superior surface smoothness, having a surface RMS as measured with atomic force microscope in a 50×50 μm$^2$ area of less than 1 nm. The surface RMS as measured with an atomic force microscope in a 2×2 μm$^2$ area preferably is less than 0.9 nm, and more preferably is less than 0.5 nm. The nitrogen-side of the vicinal substrate can be matte finish, or it can optionally be polished to a mirror finish.

The features and advantages of the invention are more fully shown by the following non-limiting examples of MOVPE GaN homoepitaxial film and device layer growth on vicinal GaN substrates.

EXAMPLE 1

A vicinal GaN substrate with 1 degree offcut towards <10-10> direction was used as a substrate for homoepitaxial growth.

Figure 12A:
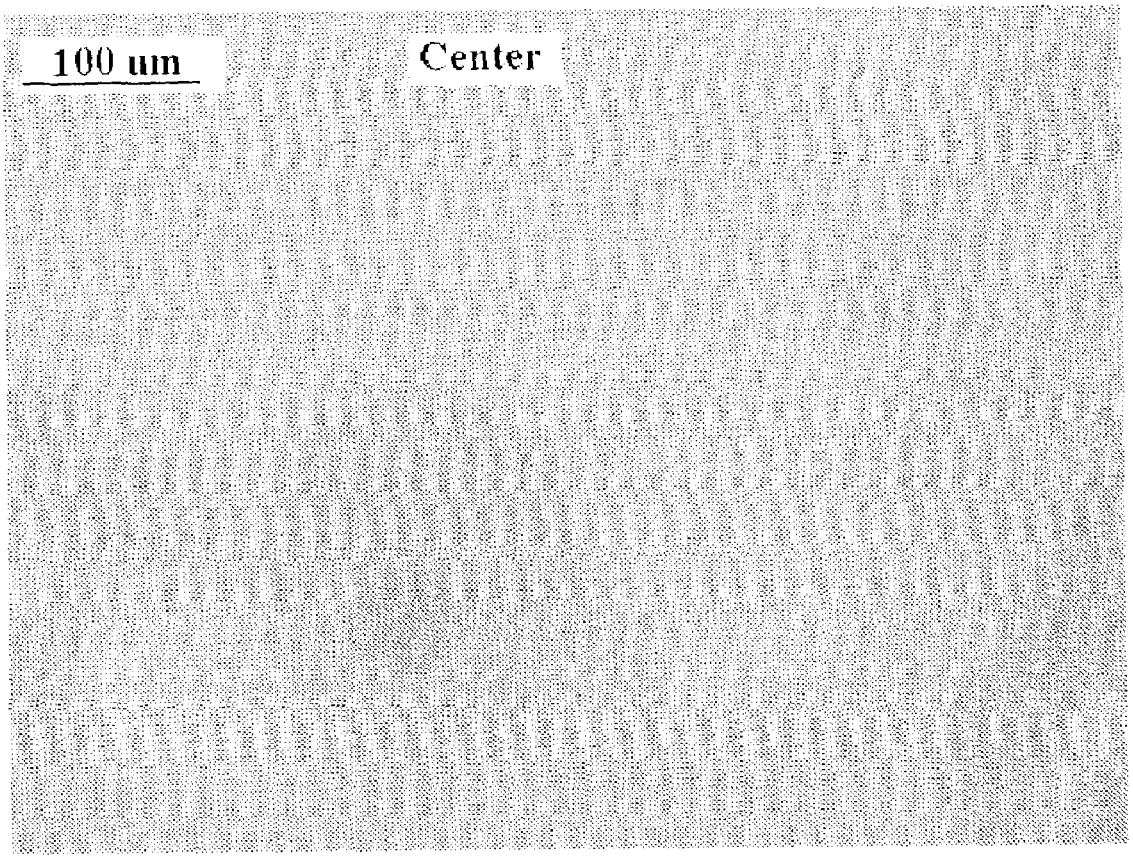
FIG. 12A is a DIC microscope image of the wafer surface near the center for a 2-µm thick homoepitaxial film growth on a vicinal GaN substrate (1 degree toward <10$\bar{1}$0>) under growth conditions including growth rate of 2 µm/hr and growth temperature of 1120° C.
Figure 12B:
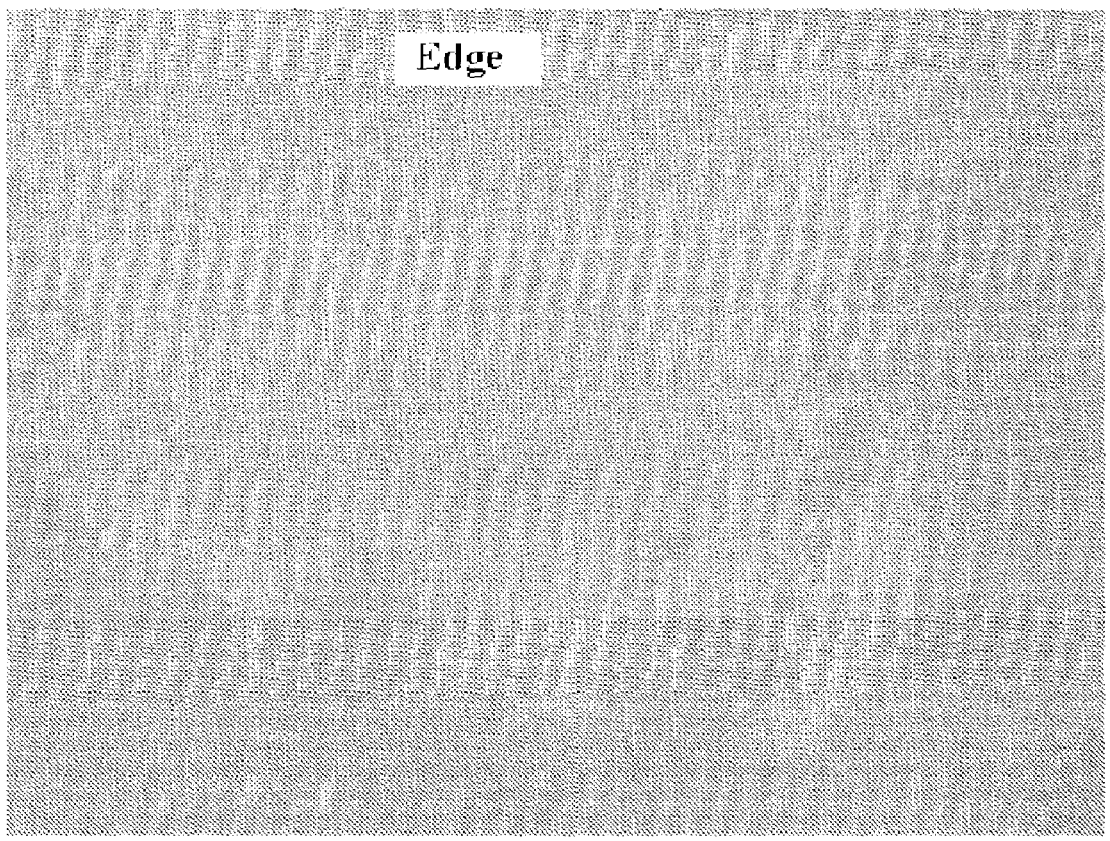
FIG. 12B a DIC microscope image of the wafer surface near the edge of the homoepitaxial film growth of FIG. 12A.

FIGS. 12A-12B provide DIC microscope image of the wafer surface near the center and near the edge, respectively, for a 2-μm homoepitaxial film grown on such vicinal GaN substrate (1 degree towards <10$\bar{1}$0>) under the following growth conditions: growth rate=2 μm/hr and growth temperature=1120° C. The homoepitaxial film was uniformly smooth, in contrast to a nominally c-plane substrate on which a non-uniform homoepitaxial film was grown.

Under the DIC optical microscope, the homoepitaxial GaN film on the vicinal GaN wafer was smooth and featureless over the entire wafer surface, as shown in FIGS. 12A-12B. Optical surface morphology of the GaN film near the edge of the vicinal substrate was identical to the morphology of the GaN film near the center of the vicinal substrate.

Figure 13:
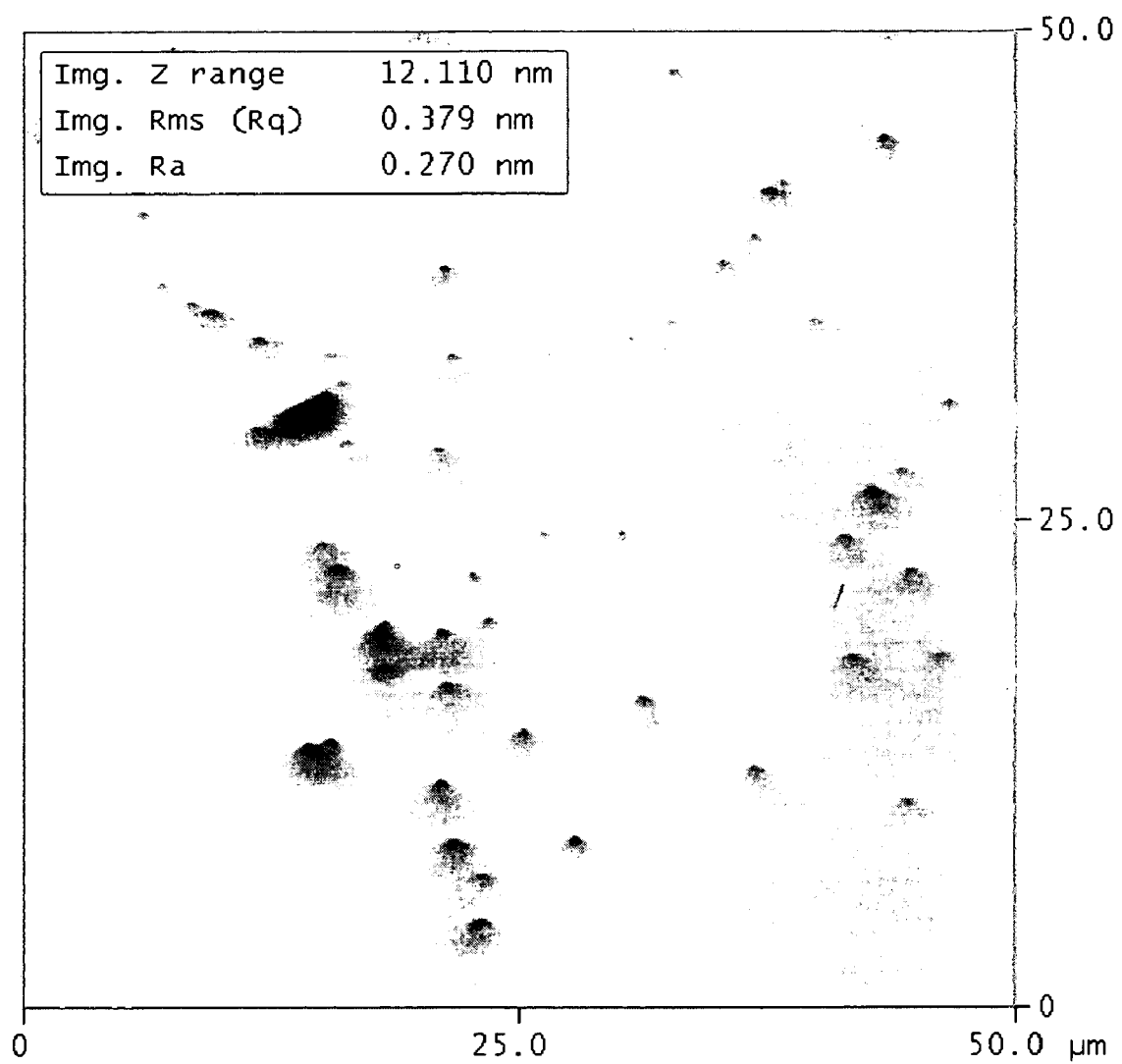
FIG. 13 is a 50×50 µm$^2$ AFM scan of the 2-µm thick homoepitaxial film growth on a vicinal substrate (1 degree offcut toward <10$\bar{1}$0>), for which the optical image of the film is shown in FIGS. 12A-12B.

AFM was further utilized to characterize surface microstructure of the GaN film on the vicinal GaN substrate. FIG. 13 is a 50×50 μm$^2$ AFM scan of the 2-μm homoepitaxial film grown the vicinal substrate (1 degree toward <10$\bar{1}$0>). The surface was exceptionally smooth with a RMS roughness of 0.38 nm in a 50×50 μm$^2$ area. The threading dislocation was decorated as growth pits and the dislocation density of the film was about 2E6 cm$^{-2}$.

Figure 14:
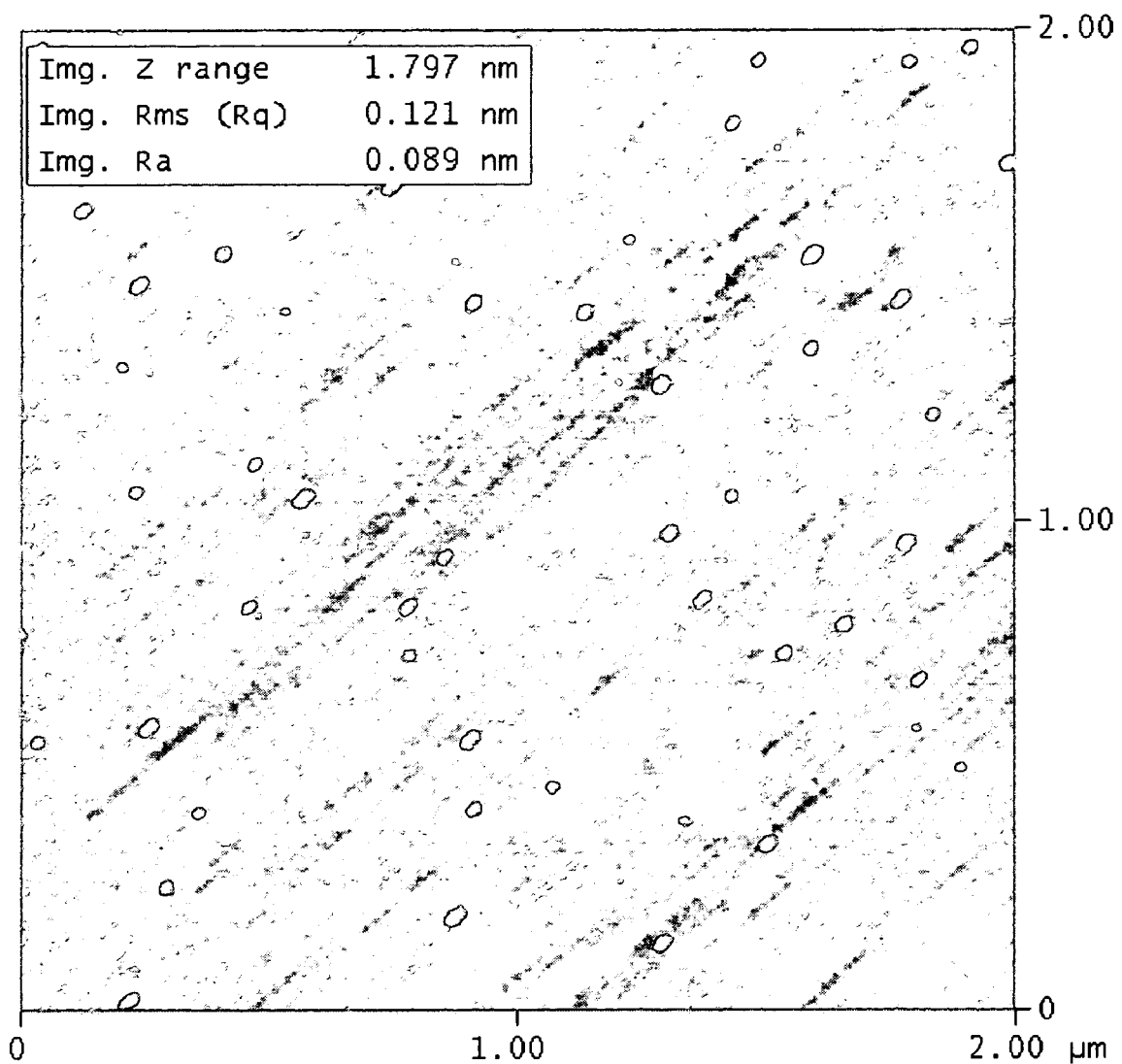
FIG. 14 is a 2×2 µm$^2$ AFM scan of the 2-µm thick homoepitaxial film growth on a vicinal GaN (0001) substrate (1 degree offcut towards <10$\bar{1}$0>), for which the optical image of the film is shown in FIGS. 12A-12B.

FIG. 14 is a 2×2 μm$^2$ AFM scan of the 2-μm thick homoepitaxial film grown on the vicinal GaN (0001) substrate (1 degree offcut towards <10$\bar{1}$0>). The RMS roughness of the homoepitaxial film was 0.12 nm in a 2×2 μm$^2$ area, demonstrating the exceptionally smooth nature of the film.

EXAMPLE 2

An AlGaN/GaN high electron mobility transistor (HEMT) structure was grown on a vicinal GaN (0001) substrate (2 degree offcut towards the <11$\bar{2}$0> direction) under the following growth conditions: growth rate=2 μm/hr and growth temperature=1170° C. The HEMT structure consisted of a 2 μm thick undoped MOVPE homoepitaxial GaN film on the vicinal substrate and 25 nm AlGaN (30 atomic % Al) layer on top of the homoepitaxial GaN film. The HEMT wafer had uniform and smooth surface morphology when examined under an optical microscope. The hillock morphology typically observed on the homoepitaxial surface on a c-plane GaN (0001) substrate was absent on the vicinal GaN wafer.

Figure 15:
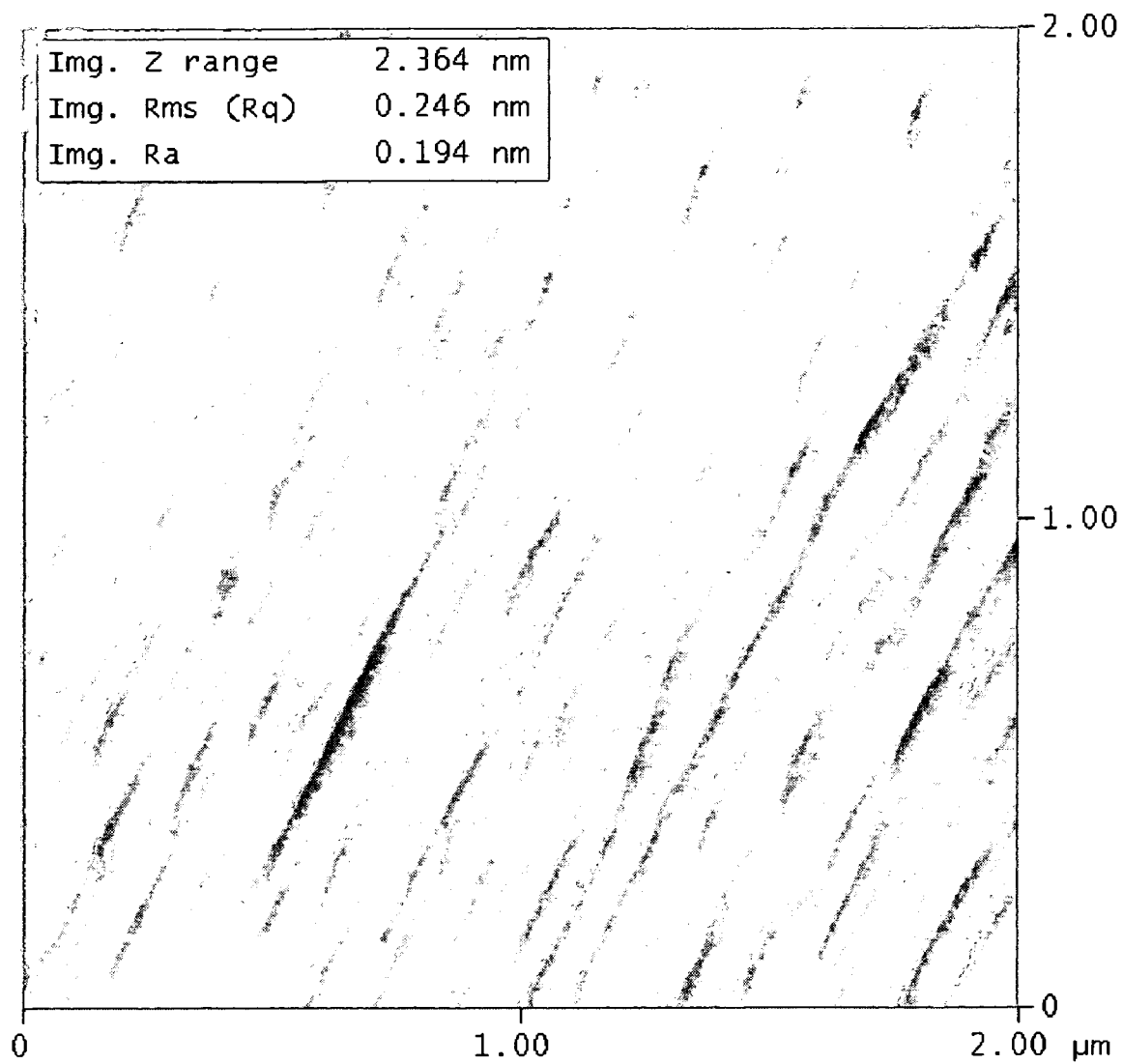
FIG. 15 is a 2×2 µm$^2$ AFM scan of the surface of an HEMT structure grown on a vicinal GaN (0001) substrate (2 degree offcut towards <11$\bar{2}$0>).

FIG. 15 is a 2×2 μm$^2$ AFM scan of the HEMT structure grown on the 2 degree offcut (towards <11$\bar{2}$0>) GaN (0001) substrate, showing a smooth surface morphology with step structures.

Figure 16:
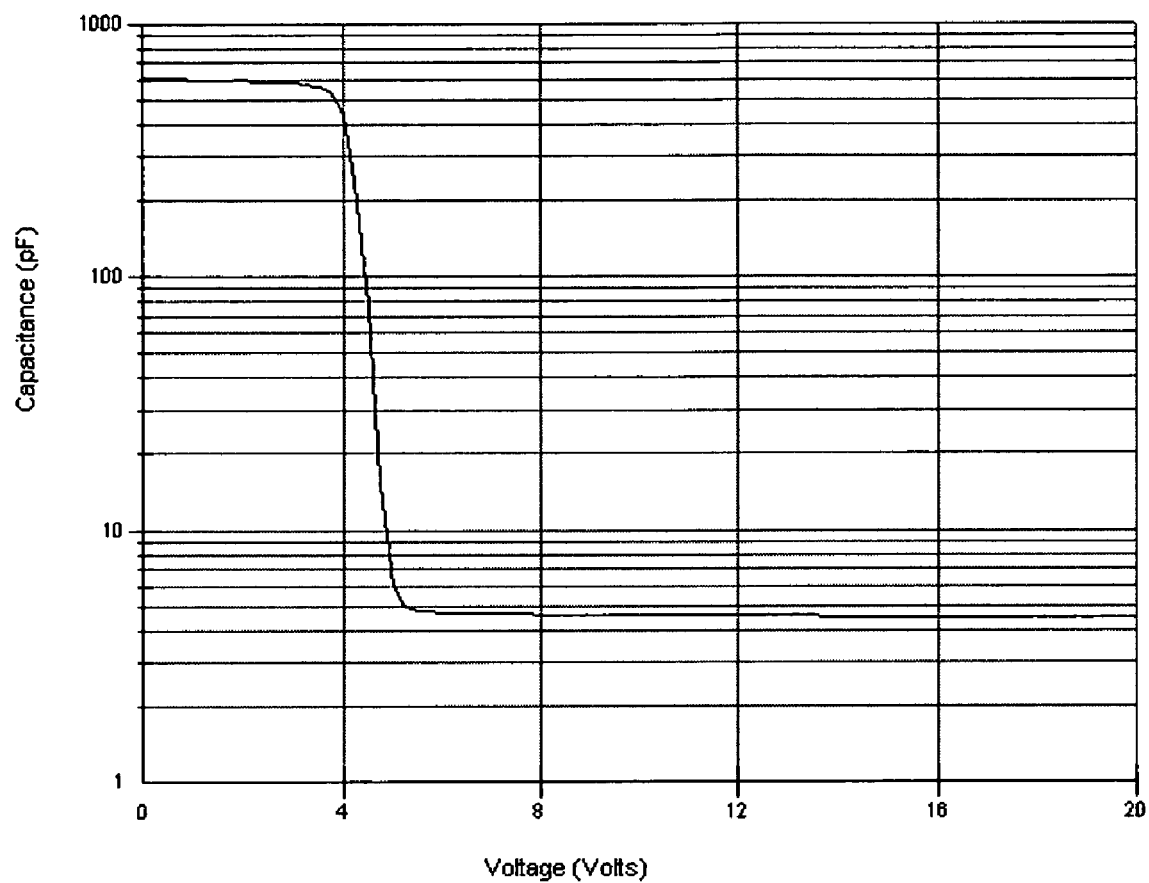
FIG. 16 is a capacitance-voltage (CV) measurement of the HEMT structure grown on 2 degree offcut (towards <11$\bar{2}$0>) GaN (0001) substrate, as determined with a mercury probe.

FIG. 16 is a capacitance-voltage (CV) measurement of the HEMT structure with a mercury probe, confirming that a two-dimensional electron gas (2DEG) was formed.

EXAMPLE 3

An AlGaN/GaN high electron mobility transistor (HEMT) structure was grown on an 8 degree offcut (towards <10$\bar{1}$0> direction) GaN (0001) substrate under the following growth conditions: growth rate=2 μm/hr and growth temperature=1170° C. The HEMT structure consisted of a thick 2 μm undoped MOVPE homoepitaxial GaN film on the vicinal substrate and 25 nm AlGaN (30 atomic % Al) layer on top of the homoepitaxial GaN film. The surface morphology of the HEMT structure was smooth and replicated the substrate morphology.

Figure 17:
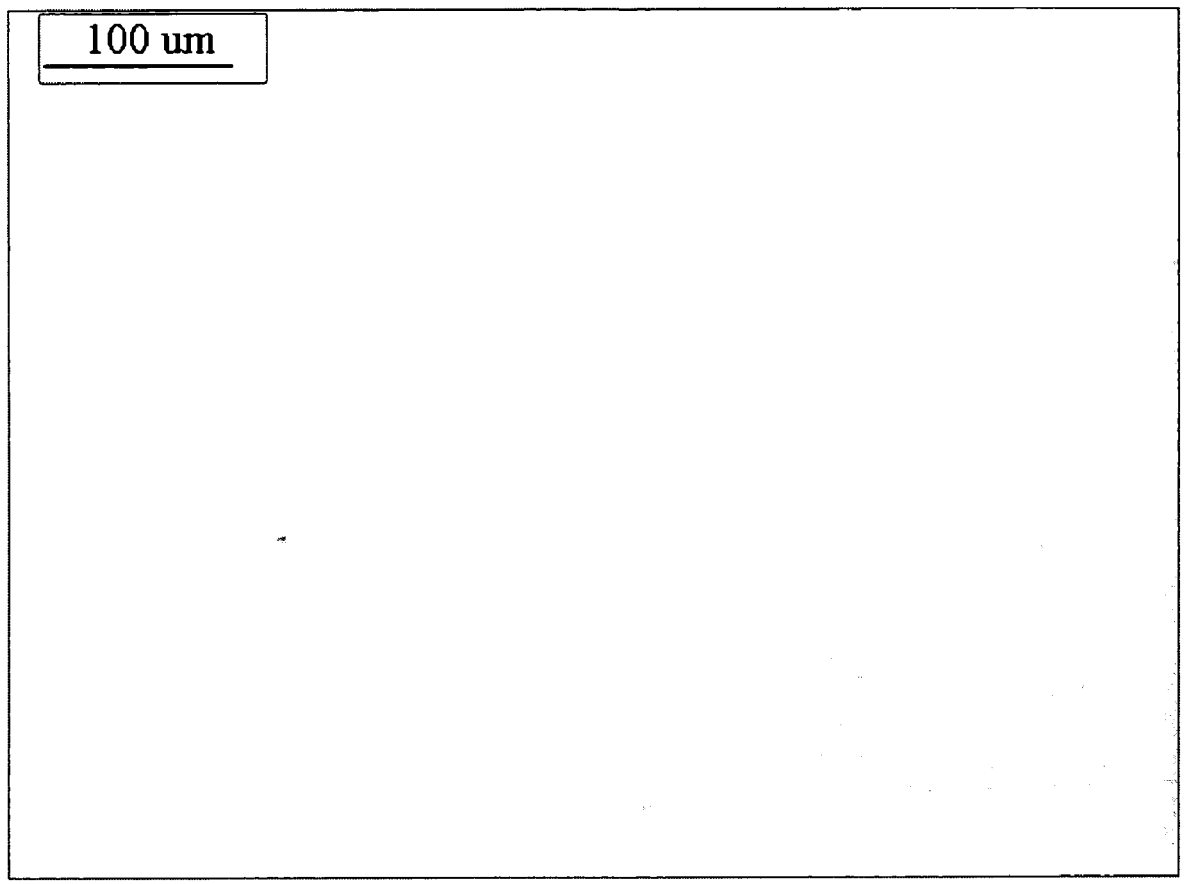
FIG. 17 is a DIC microscope image of the surface of an HEMT structure grown on an 8 degree (towards <10$\bar{1}$0>) vicinal GaN (0001) substrate, in which the morphology of the HEMT surface replicated the substrate surface shown in FIG. 8.

FIG. 17 is a DIC microscope image of the surface of the HEMT structure grown on the 8 degree (towards <10$\bar{1}$0>) vicinal GaN (0001) substrate, and the HEMT surface replicated the substrate surface. The entire wafer surface was uniform, without any hillock morphology.

Figure 18:
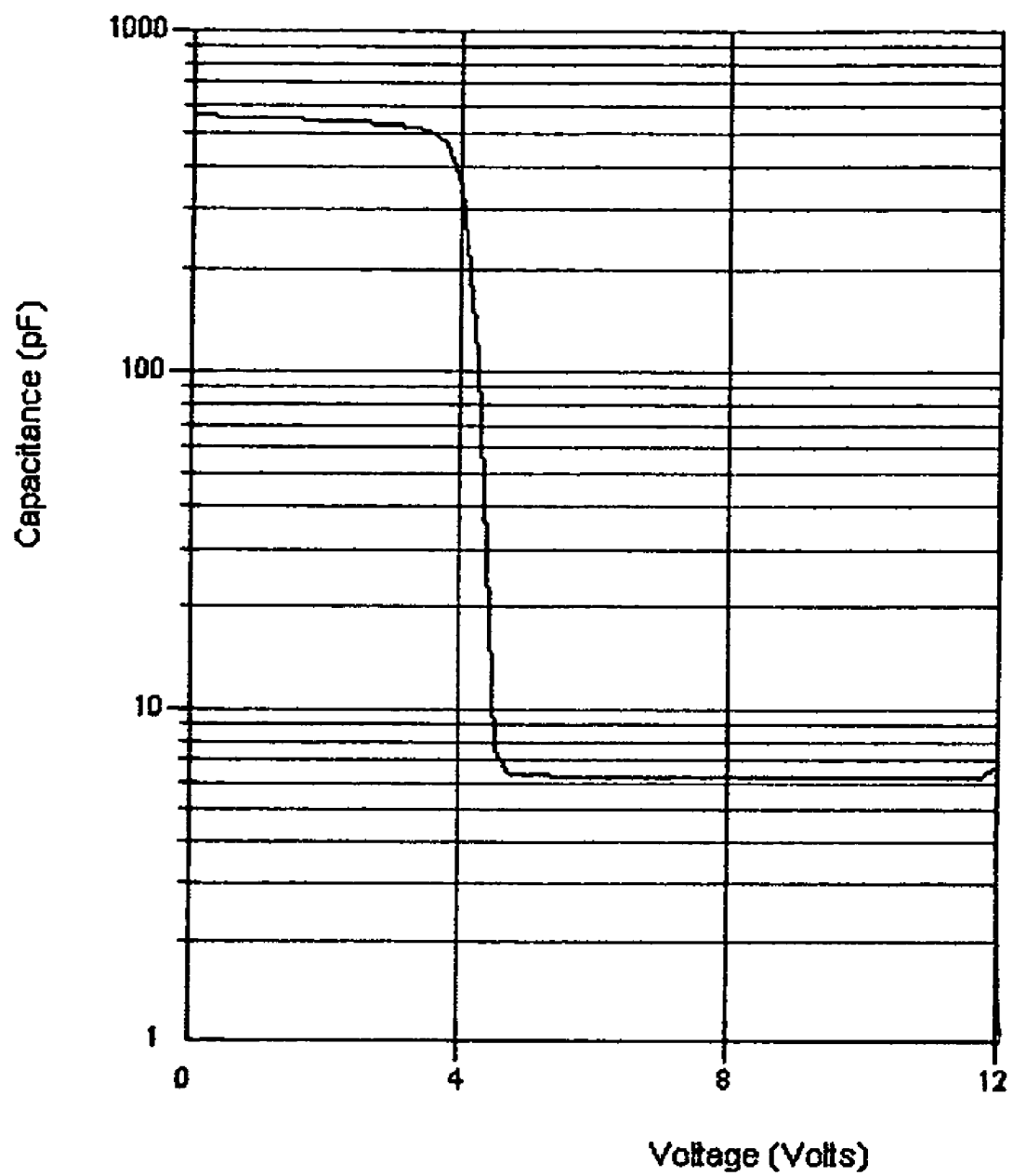
FIG. 18 is a capacitance-voltage (CV) measurement of the HEMT device layer grown the 8 degree offcut (towards <10$\bar{1}$0>) GaN (0001) substrate.

FIG. 18 is a capacitance-voltage measurement of the HEMT device layer grown on the 8 degree offcut (towards <10$\bar{1}$0>) GaN (0001) substrate. The sharp pinch-off demonstrated a good 2DEG in the AlGaN/GaN interface region.

EXAMPLE 4

An MOVPE homoepitaxial film was grown on a vicinal GaN (0001) with an offcut angle of about 1 degree but the offcut direction was between <10$\bar{1}$0> and <11$\bar{2}$0>. Under optical microscope examination, the surface morphology was uniform and quite smooth, with no hillock morphology present on the homoepitaxial film.

Figure 19:
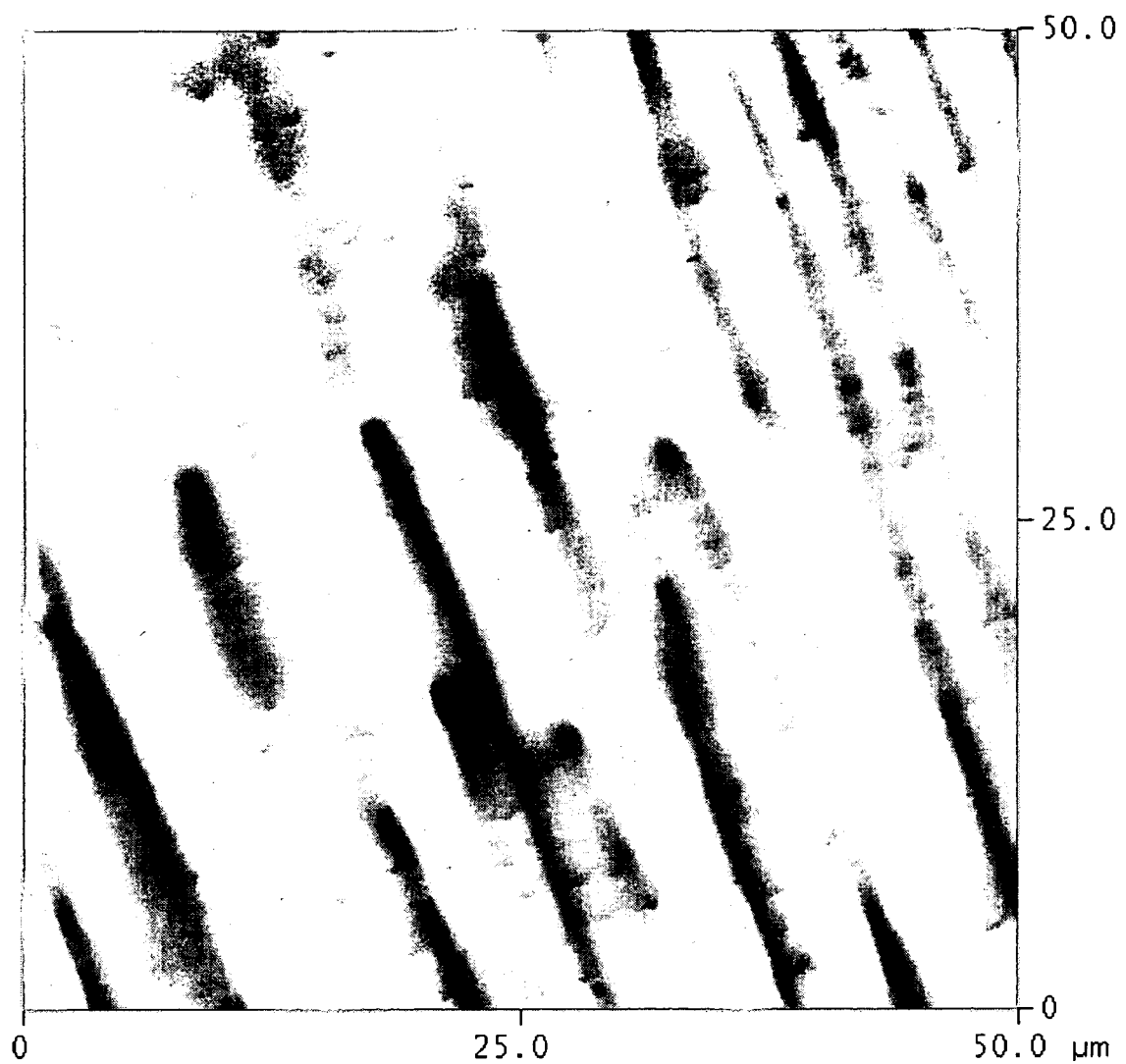
FIG. 19 is a 50×50 µm$^2$ AFM scan of a 2 µm thick homoepitaxial GaN film grown on a vicinal GaN (0001) substrate with offcut direction other than predominantly <10$\bar{1}$0> or <11$\bar{2}$0> families.

FIG. 19 is a 50×50 µm² AFM scan of the 2 µm thick homoepitaxial GaN film grown on the vicinal GaN (0001) substrate with offcut direction between <10$\bar{1}$0> or <11$\bar{2}$0>. The growth conditions included a growth rate of 2 µm/hr and a growth temperature of 1170° C. The pits were associated with dislocations.

The AFM image shows that the surface was not exactly flat, instead, having small scale ridges and valleys that were not observed on the homoepitaxial film grown on the vicinal GaN (0001) wafer with offcut towards <10$\bar{1}$0> or <11$\bar{2}$0> directions.

The foregoing illustrative examples clearly demonstrate that vicinal substrates of the present invention enable uniformly smooth homoepitaxial GaN films to be produced thereon, without the occurrence of hillock surface morphology on the homoepitaxial films formed thereon. If the starting wafer blank has a residual stress causing lattice curvature, a distribution of offcut angles will be introduced on the finished vicinal wafer during the wafer fabrication processes. As long as the offcut is larger than the lattice curvature, the entire wafer area will have an offcut, thus avoiding any incidence of hillock surface morphology. Preferably, however, residual stress in the wafer blank is removed prior to wafer fabrication processing, in order to achieve a more consistent offcut angle and direction across the entire wafer. Stress relief can be achieved, for example, by chemical etching, thermal annealing, etc., of the wafer.

The optimal MOVPE growth conditions on the vicinal GaN substrates of the invention may vary slightly depending on the degree and direction of the offcut angle. Offcut will also affect doping and impurity incorporation in the homoepitaxial film. To achieve optimal device performance, growth conditions should be optimized for the specific vicinal substrate, e.g., by empirical determination involving selective variation of growth parameters to determine an optimum set of growth conditions, as may be readily carried out within the skill of the art, based on the disclosure herein.

Furthermore, different individual microelectronic/opto-electronic devices (e.g., laser diodes, light emitting devices, transistors, diodes, detectors, etc.) may require different vicinal substrates for best performance in a specific operating regime, as also is readily determinable within the skill of the art based on the disclosure herein. Optimal MOVPE growth conditions on the vicinal GaN substrate will also depend on the specific growth reactor geometry that is employed.

While the invention has been described herein with reference to specific aspects, features and embodiments, it will be recognized that the invention is not thus limited, but rather extends to and encompasses other variations, modifications and alternative embodiments. Accordingly, the invention is intended to be broadly interpreted and construed to encompass all such other variations, modifications, and alternative embodiments, as being within the scope and spirit of the invention as hereinafter claimed.

What is claimed is:

1. A GaN substrate including a GaN (0001) surface offcut from the <0001> direction predominantly towards a direction selected from the group consisting of <10$\bar{1}$0> and <11$\bar{2}$0> directions, at an offcut angle of from about 2.5 degrees to about 5 degrees, wherein said surface has a RMS roughness measured by 50×50 µm² AFM scan that is less than 1 nm, and a dislocation density that is less than 3E6 cm$^{-2}$.

2. The GaN substrate of claim 1, wherein the GaN (0001) surface is offcut predominantly toward the <10$\bar{1}$0> direction.

3. The GaN substrate of claim 1, wherein the GaN (0001) surface is offcut predominantly toward the <11$\bar{2}$0> direction.

4. The GaN substrate of claim 1, wherein the GaN (0001) surface is offcut at an offcut angle in a range of from about 2.5 degrees to about 4 degrees.

5. The GaN substrate of claim 1, wherein said surface has a RMS roughness measured by 50×50 µm² AFM scan that is less than 0.9 nm.

6. The GaN substrate of claim 1, wherein said surface has a RMS roughness measured by 50×50 µm² AFM scan that is less than 0.5 nm.

7. The GaN substrate of claim 1, wherein said surface has a dislocation density that is less than 1E6 cm$^{-2}$.

8. The GaN substrate of claim 1, wherein said surface has a dislocation density that is less than 5E5 cm$^{-2}$.

9. A microelectronic or opto-electronic device article, comprising a GaN substrate as claimed in any of the preceding claims, and a microelectronic or opto-electronic device structure including a homoepitaxial GaN layer deposited on said surface.

10. The device article of claim 9, wherein said device structure comprises a device selected from the group consisting of laser diodes, light emitting devices, transistors, diodes, and detectors.

11. The device article of claim 9, wherein said device structure comprises a blue or shorter wavelength laser diode, or an HEMT device.

12. An electronic device structure selected from the group consisting of transistors and detectors, the electronic device structure comprising a GaN substrate including a GaN (0001) surface offcut from the <0001> direction predominantly towards a direction selected from the group consisting of <10$\bar{1}$0> and <11$\bar{2}$0> directions, at an offcut angle in a range that is from 0.2 to 10 degrees, wherein said surface has a RMS roughness measured by 50×50 µm² AFM scan that is less than 1 nm, and a dislocation density that is less than 3E6 cm$^{-2}$.

13. A microelectronic or opto-electronic device article comprising the structure of claim 12.

14. A high electron mobility transistor including the structure of claim 12.

15. The structure of claim 12, wherein the GaN (0001) surface is offcut at an offcut angle in a range of from about 2.5 to about 5 degrees.

16. The structure of claim 12, wherein the GaN (0001) surface is offcut at an offcut angle in a range of from about 5 to about 8 degrees.

17. The GaN substrate of claim 1, wherein the GaN (0001) surface is offcut at an offcut angle in a range of from about 2.5 degrees to about 4 degrees.

18. A method of forming a GaN substrate including a GaN (0001) surface offcut from the <0001> direction predominantly towards a direction selected from the group consisting of <10$\bar{1}$0> and <11$\bar{2}$0> directions, at an offcut angle in a range of from about 2.5 degrees to about 5 degrees, wherein said surface has a RMS roughness measured by 50×50 µm² AFM scan that is less than 1 nm, and a dislocation density that is less than 3E6 cm$^{-2}$, said method including growing a bulk GaN single crystal body, and processing said bulk GaN single crystal body to form at least one wafer therefrom, wherein said processing step includes a step selected from the group consisting of:

(i) a slicing step conducted in a slicing plane tilted away from the c-plane at said offcut angle in said direction selected from the group consisting of <10$\bar{1}$0> and <11$\bar{2}$0> directions, (ii) an angle lapping step conducted in a lapping plane tilted away from the c-plane at said offcut angle in said direction selected from the group consisting of <10$\bar{1}$0> and <11$\bar{2}$0> directions, and (iii) separating said bulk GaN single crystal body after growing said bulk GaN single crystal body on a vicinal heteroepitaxial substrate including a (0001) surface offcut from the <0001> direction predominantly towards a direction selected from the group consisting of <10$\bar{1}$0> and <11$\bar{2}$0> directions, at an offcut angle of from about 2.5 degrees to about 5 degrees.

19. The method of claim 18, wherein said at least one wafer is finished by at least one finishing step selected from the group consisting of lapping, polishing and chemical mechanical polishing.

20. The method of claim 18, wherein said processing step includes step (i).

21. The method of claim 18, wherein said processing step includes step (ii).

22. The method of claim 18, wherein said processing step includes step (iii).

23. The method of claim 18, wherein said vicinal heteroepitaxial substrate comprises a material selected from the group consisting of sapphire and GaAs.

24. The method of claim 18, wherein said offcut angle range is from about 2.5 degrees to about 4 degrees.

25. The method of claim 18, wherein said offcut angle range is from about 2.5 degrees to about 5 degrees.

26. A method of fabricating a microelectronic or optoelectronic device, comprising the steps of:

(a) forming a GaN substrate according to the method of claim 18; and (b) depositing on said GaN substrate a homoepitaxial III-V nitride material.

27. The method of claim 26, wherein said step of depositing a homoepitaxial III-V nitride material comprises MOVPE.

28. The method of claim 26, wherein said depositing step is carried out at a temperature in a range of from 1100 to 1225° C.

29. The method of claim 26, wherein said depositing step is carried out at a temperature in a range of from 1120 to 1170° C.

30. The method of claim 26, wherein said depositing step is carried out at a temperature in a range of from 700 to 1220° C.

31. The method of claim 26, wherein said depositing step is carried out at growth rate in a range of from 0.1 µm/hr to 50 µm/hr.

32. The method of claim 26, wherein said depositing step is carried out at growth rate in a range of from 1 µm/hr to 4 µm/hr.

33. The method of claim 26, wherein said depositing step is carried out at growth rate in a range of from about 2 µm/hr to about 4 µm/hr.

34. The method of claim 26, wherein said homoepitaxial III-V nitride material contains GaN.

35. The method of claim 34, further comprising depositing an AlGaN material on the GaN-containing homoepitaxial III-V nitride material, to form an AlGaN/GaN HEMT.

* * * * *

UNITED STATES PATENT AND TRADEMARK OFFICE
CERTIFICATE OF CORRECTION

PATENT NO. : 7,390,581 B2
APPLICATION NO. : 11/431990
DATED : June 24, 2008
INVENTOR(S) : Xueping Xu It is certified that error appears in the above-identified patent and that said Letters Patent is hereby corrected as shown below:

Column 1, line 26: "grown in the substrate" should be -- grown on the substrate --.

Column 2, lines 36-37: "Published patent application" should be -- Published Patent Application --.

Column 5, lines 32-33: "heteropitaxial" should be -- heteroepitaxial --.

Column 7, line 12: "as shown FIG. 3.." should be -- as shown in FIG. 3. --.

Signed and Sealed this

Fourteenth Day of October, 2008

JON W. DUDAS
*Director of the United States Patent and Trademark Office*